(12) United States Patent
Van Kann et al.

(10) Patent No.: US 7,624,635 B2
(45) Date of Patent: Dec. 1, 2009

(54) GRAVITY GRADIOMETER

(75) Inventors: Frank Joachim Van Kann, Nedlands (AU); John Winterflood, Nedlands (AU)

(73) Assignee: Technological Resources Pty. Ltd., Melbourne, Victoria (AU)

( * ) Notice: Subject to any disclaimer, the term of this patent is extended or adjusted under 35 U.S.C. 154(b) by 0 days.

(21) Appl. No.: 11/845,370

(22) Filed: Aug. 27, 2007

(65) Prior Publication Data
US 2008/0121037 A1   May 29, 2008

(30) Foreign Application Priority Data
Nov. 23, 2006   (AU) ............... 2006906558

(51) Int. Cl.
G01V 7/00        (2006.01)
G01P 15/11       (2006.01)
(52) U.S. Cl. ............... 73/382 R; 73/382 G; 73/514.31
(58) Field of Classification Search .......... 73/510, 73/514.04, 382 R, 382 G, 514.31, 514.17
See application file for complete search history.

(56) References Cited

U.S. PATENT DOCUMENTS

| | | | |
|---|---|---|---|
| 2,743,415 A | 4/1956 | Williams et al. | |
| 2,809,524 A | 10/1957 | Materson | |
| 3,273,397 A | 9/1966 | Forward | |
| 3,564,921 A | 2/1971 | Bell | |
| 3,758,854 A | 9/1973 | Zimmerman | |
| 3,805,398 A | 4/1974 | Russell et al. | |
| 3,926,054 A | 12/1975 | Buck | |
| 3,956,690 A | 5/1976 | Rorden | |
| 4,024,468 A | 5/1977 | Hirschi | |
| 4,398,167 A | 8/1983 | Dickie et al. | |
| 4,713,890 A | 12/1987 | Wells et al. | |
| 4,809,545 A | 3/1989 | Lyle | |
| 4,828,376 A | 5/1989 | Padera | |

(Continued)

FOREIGN PATENT DOCUMENTS

CN   1278067   12/2000

(Continued)

OTHER PUBLICATIONS

Soundararajan et al., "Nonideal Negative Resistors and Capacitors Using an Operational Amplifier", IEEE Transactions on Circuits and Systems, vol. 22, No. 9, 1975; pp. 760-763.

(Continued)

*Primary Examiner*—Helen C. Kwok
(74) *Attorney, Agent, or Firm*—Fish & Richardson P.C.

(57) ABSTRACT

A heat switch 570 is disclosed as well as a gradiometer having the heat switch. The heat switch is formed from a non-magnetic material such as a semi-conducting material. The semi-conducting material may be provided by way of a Hall effect device. The heat switches are arranged in the gradiometer on a circuit board 856. The circuit board 850 has conducting strips 856 which are connected to conducting strips on a sensor 71 by bridges 852. The heat switch 570 is connected on the opposite side of the circuit board 850 to the strips 856 and processing circuitry 859. A copper substrate 865 is provided on the same side of the circuit board as the heat switch 570 to conduct heat away from the heat switch 570 when the heat switch is closed.

25 Claims, 31 Drawing Sheets

U.S. PATENT DOCUMENTS

| | | | | |
|---|---|---|---|---|
| 4,841,772 | A * | 6/1989 | Paik | 73/382 G |
| 5,130,654 | A | 7/1992 | Mermelstein | |
| 5,224,380 | A * | 7/1993 | Paik | 73/510 |
| 5,293,119 | A | 3/1994 | Podney | |
| 5,326,986 | A | 7/1994 | Miller, Jr. et al. | |
| 5,488,295 | A | 1/1996 | Seppa | |
| 5,505,555 | A | 4/1996 | Van Kann et al. | |
| 5,587,526 | A | 12/1996 | Lymley et al. | |
| 5,589,772 | A | 12/1996 | Kugai | |
| 5,668,315 | A | 9/1997 | Van Kann et al. | |
| 5,728,935 | A | 3/1998 | Czompo | |
| 5,804,722 | A * | 9/1998 | Van Kann et al. | 73/382 G |
| 5,817,939 | A | 10/1998 | Lumley et al. | |
| 5,922,951 | A | 7/1999 | O'Keefe et al. | |
| 5,962,781 | A | 10/1999 | Veryaskin | |
| 6,082,194 | A | 7/2000 | Gladwin | |
| 6,450,028 | B1 | 9/2002 | Vail, III | |
| 6,494,091 | B2 | 12/2002 | Couture | |
| 6,526,825 | B2 | 3/2003 | Manson | |
| 6,612,171 | B1 | 9/2003 | Stephenson et al. | |
| 6,658,935 | B1 | 12/2003 | Feinberg | |
| 6,668,646 | B1 | 12/2003 | Davies et al. | |
| 6,724,188 | B2 | 4/2004 | Butters et al. | |
| 6,837,106 | B2 | 1/2005 | Etkin et al. | |
| 6,882,937 | B2 | 4/2005 | McElhinney | |
| 6,885,192 | B2 | 4/2005 | Clarke et al. | |
| 6,954,698 | B2 | 10/2005 | Tryggvason | |
| 7,053,610 | B2 | 5/2006 | Clarke et al. | |
| 7,081,747 | B2 | 7/2006 | Butters et al. | |
| 7,305,879 | B2 * | 12/2007 | Moody et al. | 73/382 R |
| 7,360,419 | B2 | 4/2008 | French et al. | |
| 2002/0092350 | A1 | 7/2002 | Etkin et al. | |
| 2003/0033086 | A1 | 2/2003 | Lee et al. | |
| 2004/0211255 | A1 | 10/2004 | Leeuwen et al. | |
| 2005/0116717 | A1 | 6/2005 | Dransfield et al. | |
| 2005/0160815 | A1 | 7/2005 | Lee | |
| 2005/0236909 | A1 | 10/2005 | Baker, Jr. | |
| 2006/0117848 | A1 | 6/2006 | Raffalt | |
| 2006/0156810 | A1 | 7/2006 | Brett et al. | |
| 2006/0207326 | A1 | 9/2006 | Moody et al. | |
| 2006/0277993 | A1 | 12/2006 | Wang et al. | |
| 2007/0241747 | A1 | 10/2007 | Morley et al. | |
| 2008/0074113 | A1 | 3/2008 | Clarke et al. | |
| 2008/0115374 | A1 | 5/2008 | Van Kann et al. | |
| 2008/0115375 | A1 | 5/2008 | Van Kann | |
| 2008/0115376 | A1 | 5/2008 | Van Kann | |
| 2008/0115377 | A1 | 5/2008 | Van Kann | |
| 2008/0115578 | A1 | 5/2008 | Van Kann et al. | |
| 2008/0116905 | A1 | 5/2008 | Van Kann | |
| 2008/0120858 | A1 | 5/2008 | Van Kann et al. | |
| 2008/0121035 | A1 | 5/2008 | Van Kann et al. | |
| 2008/0121036 | A1 | 5/2008 | Van Kann et al. | |
| 2008/0122435 | A1 | 5/2008 | Van Kann et al. | |
| 2008/0163682 | A1 | 7/2008 | Van Kann et al. | |
| 2008/0173090 | A1 | 7/2008 | Van Kann et al. | |
| 2008/0257038 | A1 | 10/2008 | Van Kann et al. | |
| 2008/0282796 | A1 | 11/2008 | Van Kann et al. | |
| 2008/0302179 | A1 | 12/2008 | Van Kann et al. | |
| 2008/0302180 | A1 | 12/2008 | Van Kann et al. | |
| 2008/0307883 | A1 | 12/2008 | Van Kann et al. | |

FOREIGN PATENT DOCUMENTS

| | | |
|---|---|---|
| DE | 197 51 724 | 7/1999 |
| JP | 2002-40155 | 6/2002 |
| RU | 2 046 380 | 10/1995 |
| RU | 2 056 642 | 3/1996 |
| RU | 2 127 439 | 3/1999 |
| RU | 2 156 481 | 9/2000 |
| RU | 2 167 437 | 5/2001 |
| RU | 2 171 481 | 7/2001 |
| RU | 2 171 482 | 7/2001 |
| RU | 2 171 483 | 7/2001 |
| RU | 2 172 967 | 8/2001 |
| RU | 2 175 773 | 11/2001 |
| RU | 2 221 263 | 1/2004 |
| RU | 2 242 032 | 12/2004 |
| RU | 2 253 138 | 5/2005 |
| RU | 2 253 882 | 6/2005 |
| RU | 2 290 674 | 10/2005 |
| WO | WO 90/07131 | 6/1990 |
| WO | 97/41459 | 11/1997 |
| WO | 00/31550 | 6/2000 |
| WO | 02/44757 | 6/2002 |
| WO | WO 2007/038819 | 4/2007 |
| WO | WO 200/061282 | 5/2008 |

OTHER PUBLICATIONS

Paik, H., Superconducting tunable-diaphragm transducer for sensitive acceleration measurements, Journal of Applied Physics, vol. 47, No. 3, Mar. 1976, pp. 1168-1178.

Forward, R., "Electronic cooling of resonant gravity gradiometers", Journal of Applied Physics, vol. 50, No. 1, Jan. 1979, pp. 1-6.

Paik, H., J., "Superconducting tensor gravity gradiometer", Second International Symposium on Inertial Technology of Surveying and Geodesy, Banff, Canada, Jun. 1981.

Moody, M., et al., Superconducting gravity gradiometer for space and terrestrial applications:, Journal of Applied Physics, vol. 60, No. 12, Dec. 15, 1986, pp. 4308-4315.

Chan, H., et al, "Superconducting gravity gradiometer for sensitive gravity measurements", Physical Review D., vol, 35, No. 12, Jun. 15, 1987, pp. 3551-3571.

Moody, M., et al., "Gauss's Law Test of Gravity at Short Range", Physical Review Letters, vol. 70, No. 9, Mar. 1, 1993, pp. 1195-1198.

Paik, H., et al., 6 page reprint of "Airborne/shipborne SGG Survey System", Proceedings of the International Symposium on Kinematic Systems in Geodesy, Geomatics and Navigation, Banff, Canada, Jun. 1997, pp. 565-570.

Moody, M., et al., "Three-axis superconducting gravity gradiometer for sensitive gravity measurements", Review of Scientific Instruments, vol. 73, No. 11, Nov. 2002, pp. 3957-3974.

Moody, M., et al,., "Principle and performance of a superconducting angular accelerometer", Review of Scientific Instruments, vol. 74, No. 3, Mar. 2003, pp. 1310-1318.

Nadal-Guardia et al., "Constant Charge Operation of Capacitor Sensors Based on Switched Current Circuits", IEEE Sensors Journal, vol. 3, No. 6, Dec. 6, 2003, pp. 835-842.

Moody et al., "A Superconducting Gravity Gradiometer for Inertial Navigation", Position Location and Navigation Symposium, 2004, PLANS 2004, Apr. 26-29, 2004, pp. 775-781.

Robert Matthews, "The University of Western Australia Gravity Gradiometer Group, Mobile Gravity Gradiometry," *Department of Physics-University of Western Australia*, 2002, 454 pages.

Mark Helm Dransfield, "Airborne Gravity Gradiometry," *The University of Western Australia Department of Physics*, 1994, 254 pages.

Robert David Penny, Development of Two Prototype Cryogenic Gravity Gradiometers for Geophysical Exploration, *Department of Physics-University of Western Australia*, 1992, 258 pages.

F. J. van Kann, *End-of-Grant Report: Project No. 880*, "An Airborne Cryogenic Gravity Gradiometer for Geophysical Exploration," The University of Western Australia Department of Physics, May 1992, 68 pages.

* cited by examiner

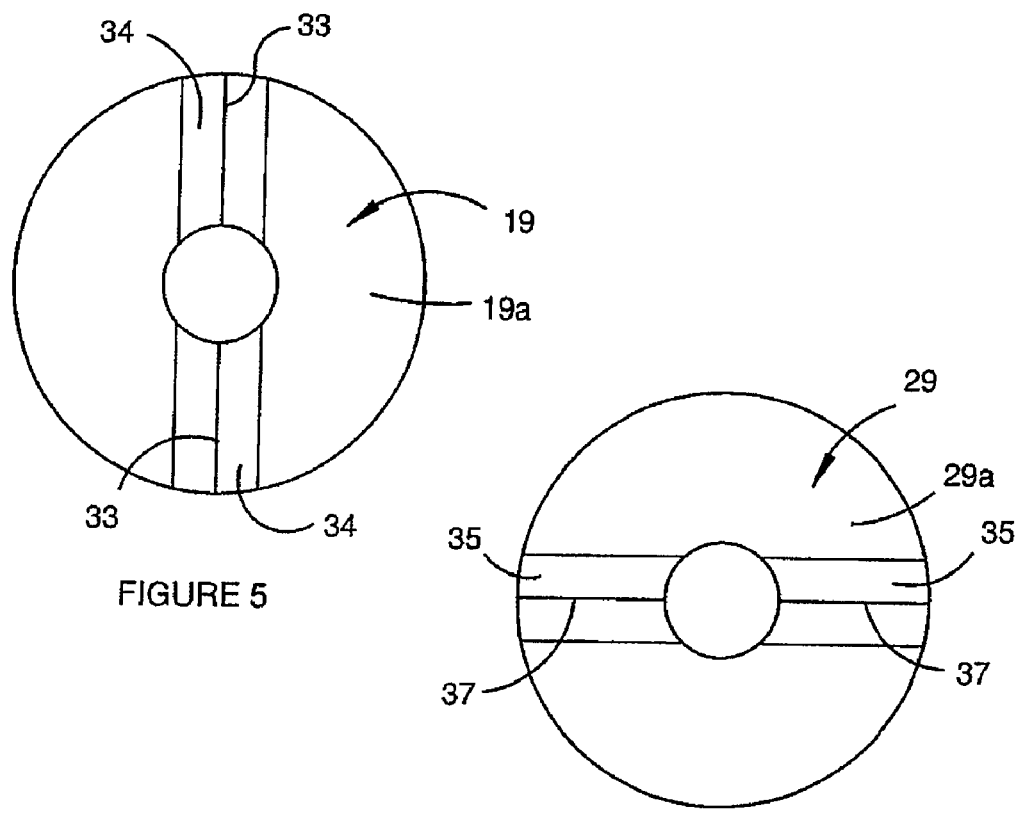
FIGURE 5
FIGURE 6
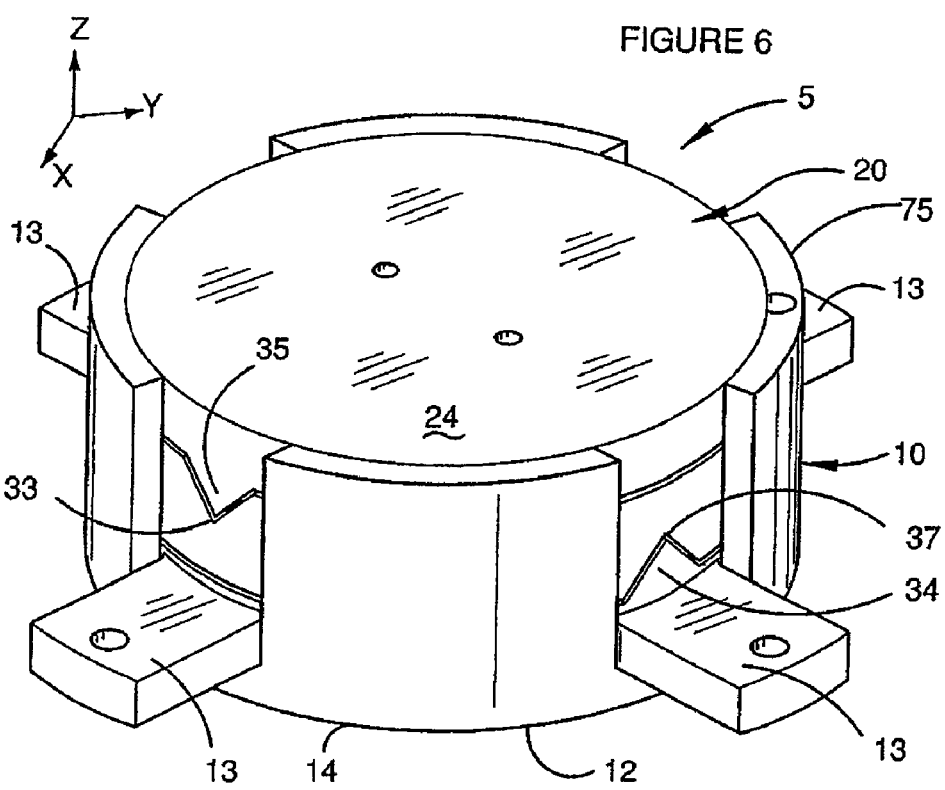
FIGURE 7

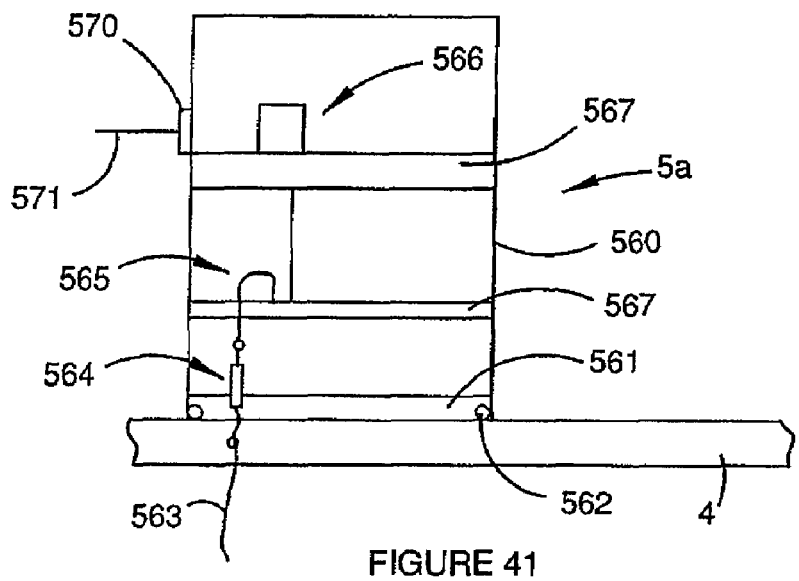
FIGURE 41
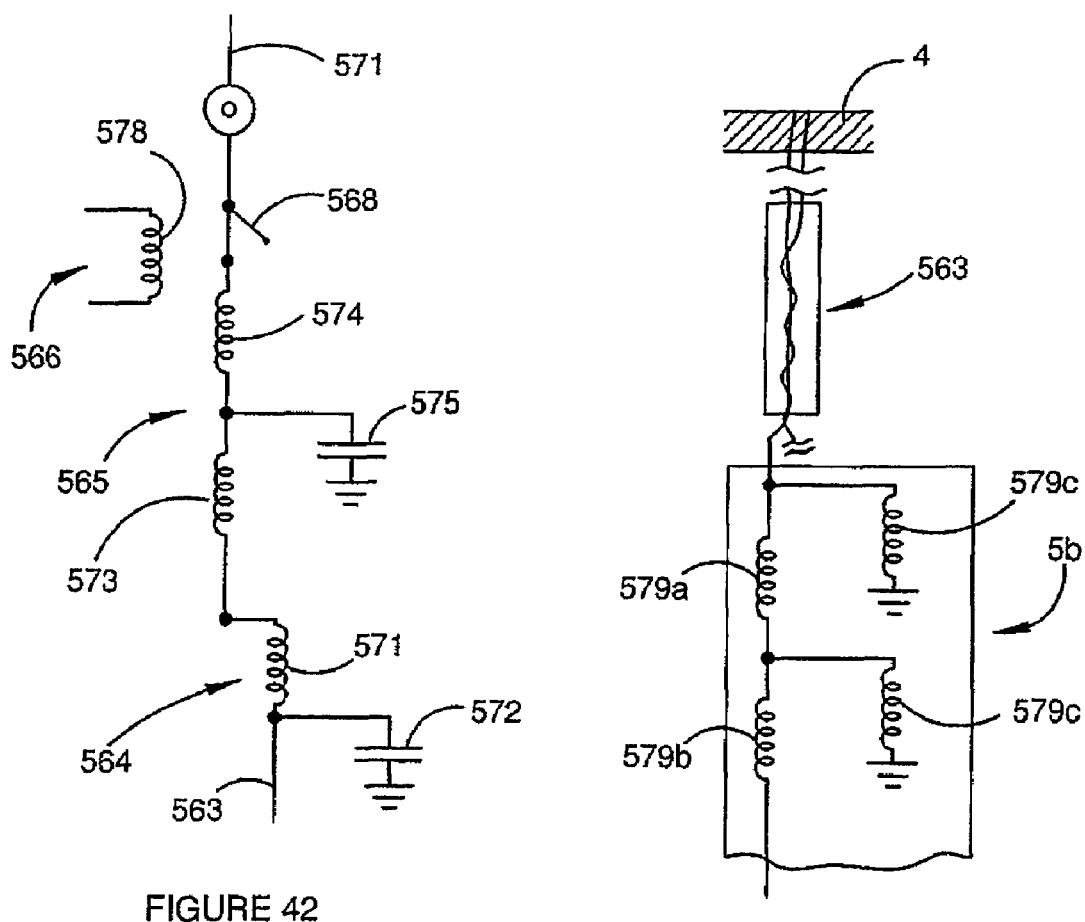
FIGURE 42
FIGURE 42A

GRAVITY GRADIOMETER

FIELD OF THE INVENTION

This invention relates to a gravity gradiometer, and in particular, but not exclusively, to a gravity gradiometer for airborne use. The invention has particular application for measuring diagonal and off-diagonal components of the gravitational gradient tensor.

BACKGROUND OF THE INVENTION

A gravity gradiometer is disclosed in our International Patent Application No. PCT/AU2006/001269 and several concurrently filed applications. The content of International Patent Application No. PCT/AU2006/001269 is incorporated into this specification by this reference.

Gravimeters are widely used in geological exploration to measure the first derivatives of the earth's gravitational field. Whilst some advances have been made in developing gravimeters which can measure the first derivatives of the earth's gravitational field because of the difficulty in distinguishing spatial variations of the field from temporal fluctuations of accelerations of a moving vehicle, these measurements can usually be made to sufficient precision for useful exploration only with land-based stationary instruments.

Gravity gradiometers (as distinct from gravimeters) are used to measure the second derivative of the gravitational field and use a sensor which is required to measure the differences between gravitational forces down to one part in $10^{12}$ of normal gravity.

Typically such devices have been used to attempt to locate deposits such as ore deposits including iron ore and geological structures bearing hydrocarbons.

The above-mentioned gradiometer has a sensor in the form of a sensor mass which is pivotally mounted for movement in response to the gravity gradient.

The gravity gradiometer disclosed in the previously mentioned International application includes sensor bars which are mounted in a housing for pivotal movement in response to the gravity gradient about a flexure web. Transducers which include coils are provided for measuring movement of the masses by a change of inductance of the coils when the masses move closer to or further away from the coils to thereby provide a measure of the movement to in turn enable a measure of the gravity gradient tensor to be made. The sensing coils are formed from superconducting material and are operated at cryogenic temperatures. A current is initially induced in the coils and that current is changed when the inductance of the coils is changed so that the change in current provides the measure of the gravity gradient. The current is initially induced in the coils by providing a heat switch in the form of a resistor so that the superconducting circuit can temporarily be made non-superconducting by elevating the temperature of part of the circuit above the super-conducting threshold so the circuit effectively becomes open at that point. Input leads are connected to the circuit so that a current can be supplied from a current source to induce the initial current in the circuit. The resistor is then deactivated so that the part of the circuit again becomes superconducting so that the induced current simply continues to circulate through the circuit.

Typically in order to form the heat switch, part of the superconducting circuit is simply wound around the resistor so that it heated by heat generated when current flows through the resistor to thereby cause that part of the circuit to warm to a temperature above the superconducting transition of the superconducting material. The formation of the superconducting material about the resistor can be difficult and also, since the resistor is relatively large, this form of heat switch has disadvantages in gradiometers where space considerations can be of significance.

SUMMARY OF THE INVENTION

The object of this invention is to provide an alternative form of heat switch suitable for a gravity gradiometer which overcomes the disadvantages of conventional resistor-type heat switches.

The invention provides a super-conducting circuit having a heat switch for temporarily heating part of the circuit above superconducting transition, comprising:
   at least one circuit part formed from a superconducting material;
   a heat switch adjacent the circuit part;
   the heat switch being formed from a semi-conducting material.

The present invention thereby provides a heat switch for use in a superconducting circuit which will operate in cryogenic temperatures required in order to produce super-conduction in the superconducting circuit, is non-magnetic and is also very compact, thereby lending itself to use in environments such as gravity gradiometers where space considerations are significant.

Preferably the semi-conducting material comprises a cryogenic Hall effect device.

The invention also provides a gravity gradiometer for measuring components of the gravity gradient tensor, comprising:
   a sensor for providing a measure of at least one component of the gravity gradient tensor;
   a superconducting circuit for transmitting electrical signals within the gradiometer to facilitate measurement of the at least one component of the gravity gradient tensor; and
   a heat switch formed from a semi-conducting material for warming part of the circuit to a temperature above the superconducting transition to open the circuit to enable an initial current to be induced in the circuit from an external current source.

Preferably the semi-conducting material comprises a cryogenic Hall effect device.

Preferably the heat switch has a pair of pins for supplying current to the heat switch to heat the heat switch, the superconducting circuit being provided around or adjacent one of said pins, a conducting substrate arranged in heat conducting disposition with respect to the super-conducting circuit so that when the circuit is closed after heating to its superconducting transition state, heat is conducted away from the pin and the super-conducting circuit by the substrate.

Preferably the substrate comprises a copper substrate.

Preferably the super-conducting circuit is arranged in heat conducting disposition with respect to the substrate by being attached to the substrate by varnish.

Preferably the heat switch is provided on one side of a circuit board, the other side of the circuit board containing processing circuitry, the circuit board being disposed adjacent the sensor, the circuit board having conducting strips for conducting current to the circuitry on the circuit board and the conducting strips being connected to the sensor by bridges.

Preferably the sensor comprises a sensor mass and a transducer and the circuit forms part of the transducer for supplying a current indicative of movement of the mass in response to the gravity gradient.

Preferably a plurality of the heat switches are formed in the circuit for enabling various parts of the circuit to be opened to induce currents in the various parts of the circuit.

The invention also provides a gravity gradiometer for measuring components of the gravity gradient tensor, comprising:
a housing;
a mass supported by the housing and removable relative to the housing in response to changes in the gravity gradient tensor;
a sensor for providing an output signal indicative of the change, the sensor being supported on a support member which in turn is supported by the housing;
conductors on the support member for supplying electric current from the sensor;
a circuit board supported by the housing and spaced from the support member, conducting strips on the circuit board for connecting the sensor to circuitry mounted on the circuit board; and
a plurality of bridges extending between the conductors on the support member and the conductor strips on the circuit board.

Preferably the conductor strips on the circuit board are formed from super-conducting material.

Preferably the super-conducting material is niobium.

Preferably the side of the circuit board opposite the conductor strips and circuitry has a heat switch formed from a non-magnetic material for warming part of the circuitry to a temperature above the super-conducting transition to open the circuitry to enable an initial current to be induced in the circuitry from an external current source.

Preferably the heat switch comprises a non-magnetic heat switch.

Preferably the non-magnetic heat switch is formed from a semi-conducting material.

Preferably the semi-conducting material comprises a cryogenic Hall effect device.

Preferably the heat switch has a pair of pins for supplying current to the heat switch to heat the heat switch, the super-conducting circuit being provided around or adjacent one of said pins, a conducting substrate arranged on the circuit board and in heat conducting disposition with respect to the super-conducting circuit so that when the circuit is closed after heating to its super-conducting transition state, heat is conducted away from the pin and the super-conducting circuit by the substrate.

Preferably the substrate comprises a copper substrate.

Preferably the super-conducting circuit is arranged in heat conducting disposition with respect to the substrate by being attached to the substrate by varnish.

Preferably the heat switch is provided on one side of the circuit board, the other side of the circuit board containing processing circuitry, the circuit board being disposed adjacent the sensor, the circuit board having conducting strips for conducting current to the circuitry on the circuit board and the conducting strips being connected to the sensor by bridges.

BRIEF DESCRIPTION OF THE DRAWINGS

Preferred embodiments of the invention would be described, by way of example, with reference to the accompanying drawings, in which:

FIG. 5 is a cross-sectional view along the line IV-IV of FIG. 3;

FIG. 6 is a cross-sectional view along the line V-V of FIG. 3;

FIG. 7 is a view of the assembled structure;

FIG. 41 is a drawing of a connector used in the preferred embodiments of the invention;

FIG. 42 is a circuit diagram of the connector of FIG. 41;

FIG. 42A is a circuit diagram used with the circuit of FIG. 42;

DETAILED DESCRIPTION OF THE PREFERRED EMBODIMENTS

Figure 1:
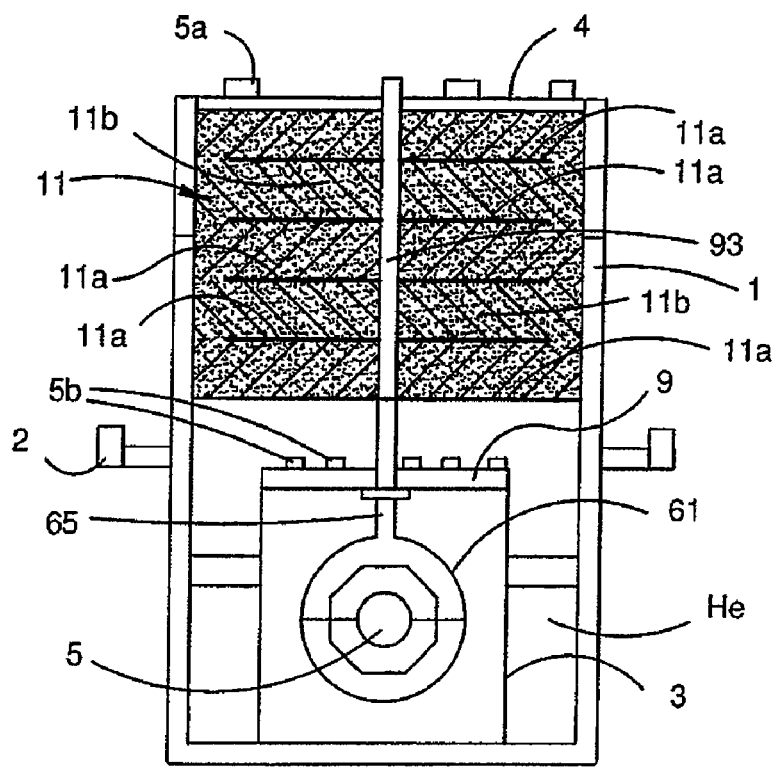
FIG. 1 is a schematic view of a gradiometer of one embodiment of the invention.

FIG. 1 is a schematic view of a gravity gradiometer according to one embodiment of the invention.

The gradiometer shown in FIG. 1 comprises a double walled Dewar 1 which is supported in an external platform 2. The external platform 2 enables adjustment of the Dewar and therefore the contents of the Dewar about three orthogonal axes. The external platform 2 is generally known and its adjustment by suitable motors or the like is also known. Thus, a detailed description will not be provided.

A vacuum canister 3 is provided in the Dewar and the Dewar is supplied with liquid gas such as liquid helium He so that the gradiometer can operate at cryogenic temperature. The Dewar 1 is closed by an end plate 4 which includes connectors 5a for connecting electrical leads (not shown) to external components (not shown).

The canister 3 is closed by an end plate 9 which includes connectors 5b for connecting electric leads (not shown) to the connectors 5a. The gradiometer has a main casing 61 formed from a twelve-sided ring 62 and hemispherical domes 63 (see FIG. 12). An internal mounting 5 is connected to the ring 62. The ring 62 carries a support 65 to which a feed through flange 9 is coupled. A neck plug 11 formed of baffles 11a which sandwich foam 11b is provided above the canister 3. The baffles 11a are supported on a hollow rod 93 which extends to the canister 3 and which is also used to evacuate the canister 3.

Figure 2:
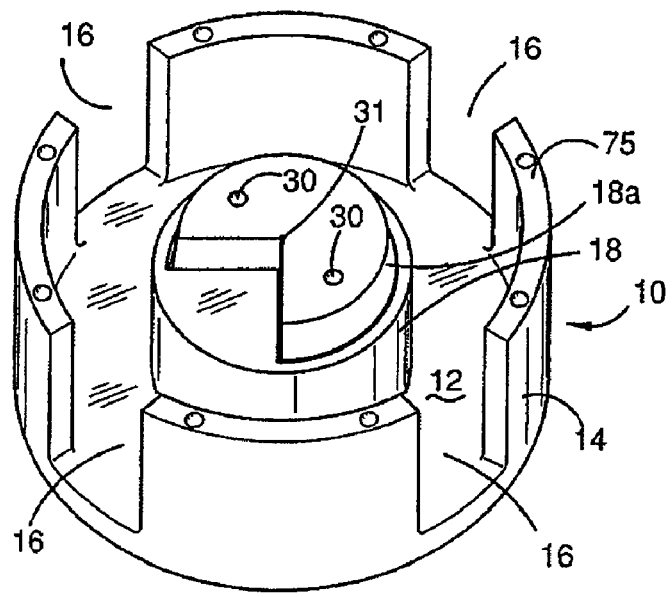
FIG. 2 is a perspective view of a first mount forming part of a mounting of the gradiometer of the preferred embodiment.

With reference to FIG. 2 a first mount 10 of a rotatable mounting 5 (FIG. 7) of the gradiometer is shown which comprises a base 12 and an upstanding peripheral wall 14. The peripheral wall 14 has a plurality of cut-outs 16. The base 12 supports a hub 18.

Figure 3:
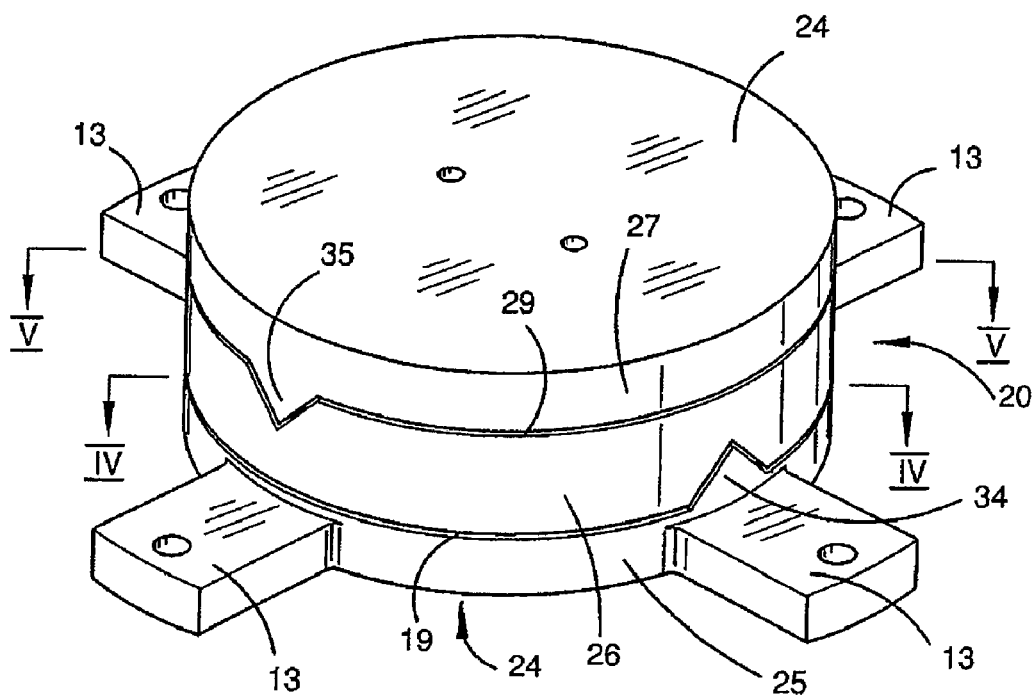
FIG. 3 is a view of a second mount of the mounting.
Figure 4:
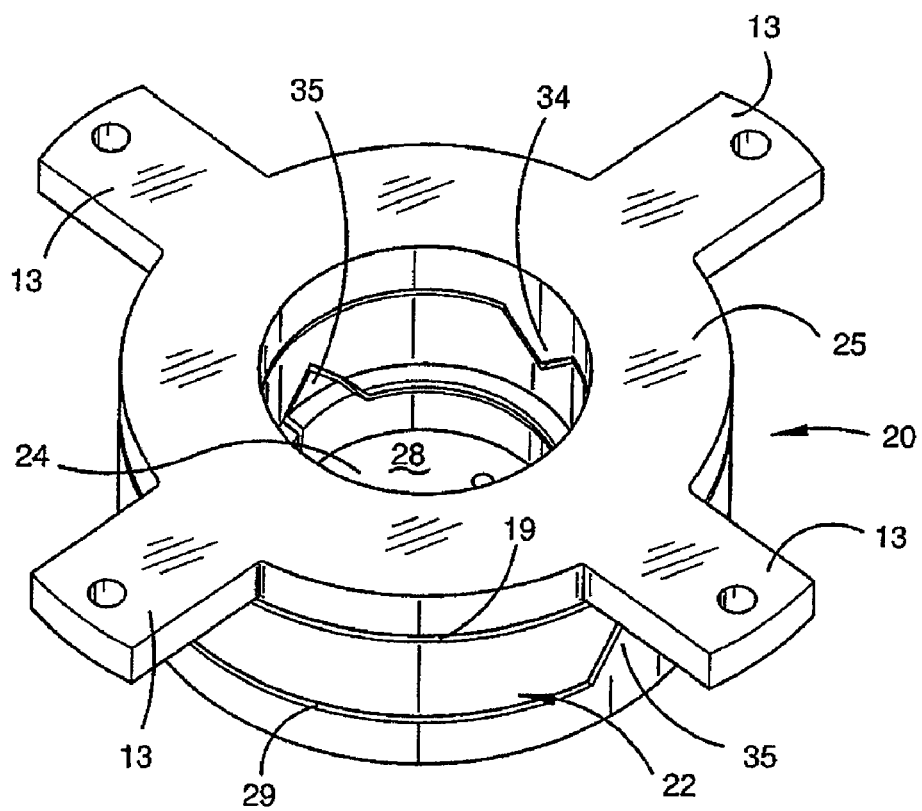
FIG. 4 is a view from underneath the mount of FIG. 3.

FIGS. 3 and 4 show a second mount 20 which comprises a peripheral wall 22 and a top wall 24. The peripheral wall 22 has four lugs 13 for connecting the mount to the casing 61. The top wall 24 and the peripheral wall 22 define an opening 28. The peripheral wall 22 has a first part 25, a second part 26 and a third part 27. The second mount 20 is a monolithic integral structure and the first part 25 is formed by making a circumferential cut 19 through the peripheral wall except for the formation of flexure webs as will be described hereinafter. The third part 27 is formed by making a second circumferential cut 29 through the peripheral wall 22 except for flexure webs which will also be described hereinafter. The second mount 20 is mounted on the first mount 10 by locating the hub 18 into the opening 28 and the lugs 13 through respective cut-outs 16 as is shown in FIG. 7.

The first mount 10 is joined to the second mount 20. The first flexure web 31 is formed in the first mount 10 so a primary mount portion of the mount 10 can pivot about the web 31 relative to a secondary mount portion of the mount 10. This will be described in more detail with reference to the second embodiment shown in FIGS. 13 to 21.

The lugs 13 connect the mounting 5 in the canister 3 which, in turn, locates in the Dewar 1 for cryogenic operation of the gradiometer.

The Dewar is in turn mounted in a first external platform for course rotational control of the gradiometer about three orthogonal x, y, z axes. The mounting 5 mounts the sensor 40 (which will be described in more detail hereinafter and which is preferably in the form of a mass quadrupole) for much finer rotational adjustment about the x, y and z axes for stabilising the gradiometer during the taking of measurements particularly when the gradiometer is airborne.

The first flexure web 31 allows the first mount 10 to move relative to the second mount 20 about a z axis shown in FIG. 7.

FIGS. 5 and 6 are views along the lines IV and V respectively which in turn are along the cuts 19 and 29 shown in FIG. 3. The peripheral wall 22 may be cut by any suitable cutting instrument such as a wire cutter or the like. FIG. 5 shows the bottom surface 19a formed by the cut 27. As is apparent from FIGS. 3 and 5 the cut 27 has two inverted v-shaped peaks 34. The apex of the peaks 34 is not cut and therefore form a second flexure web 33 which join the first part 25 to the second part 26. Thus, the second part 26 is able to pivotally rotate relative to the first part 25 about the x axis in FIG. 7. The second cut 29 is shown in FIG. 6 and again the bottom surface 29a formed by the cut 29 is visible. Again the second cut 29 forms two v-shaped peaks 35 and the apexes of the peaks 35 are not cut and therefore form a third flexure web 37 which connect the second part 26 to the third part 27. Thus, the third part 27 is able to pivotal rotate about the y axis shown in FIG. 7.

Figure 8:
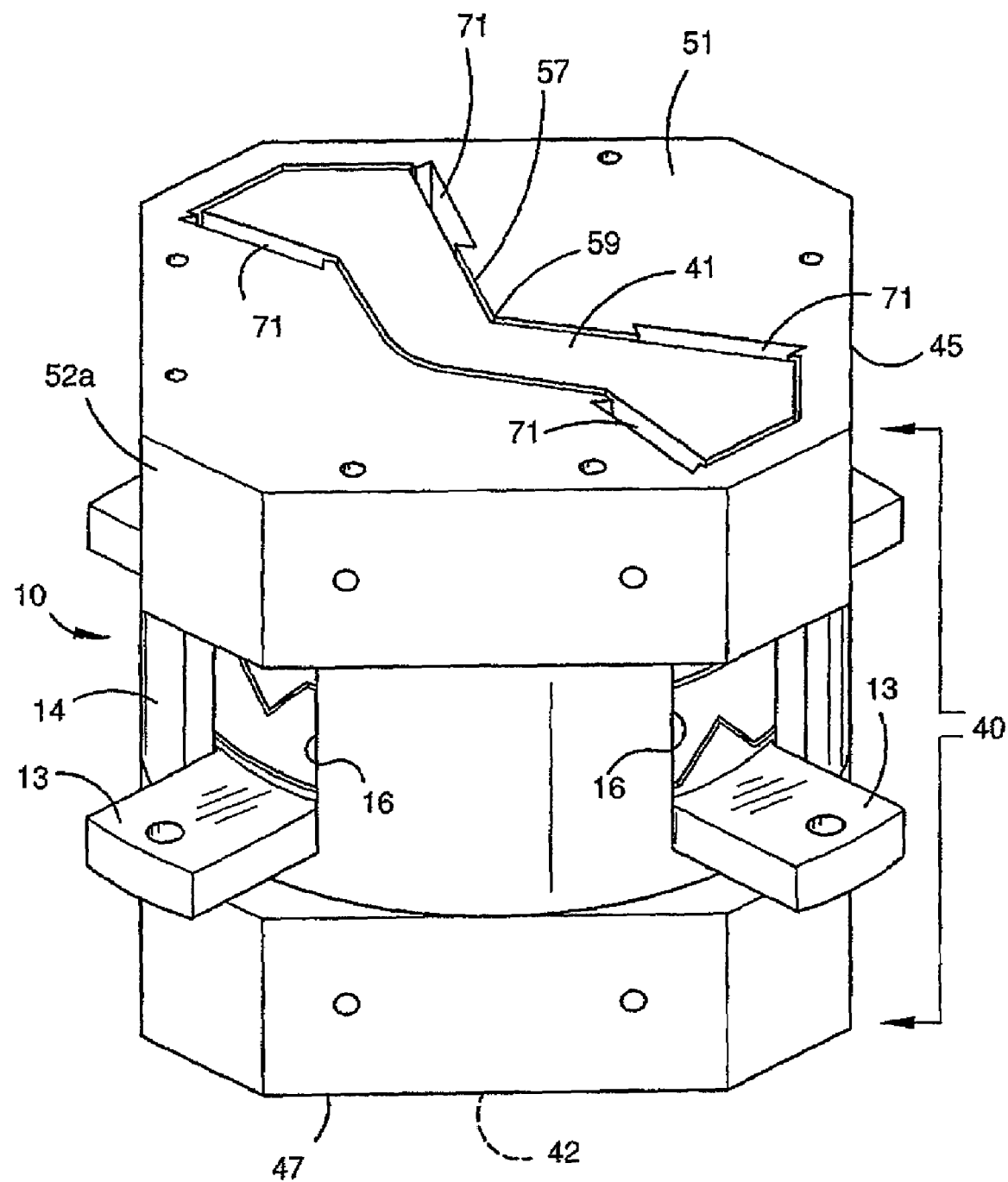
FIG. 8 is a view showing the sensor mounted on the gimbal structure.

FIG. 8 shows sensor 40 mounted on the mounting. The sensor 40 is an Orthogonal Quadrupole Responder—OQR sensor formed of a first mass and a second mass in the form of a first bar 41 and a second bar 42 (not shown in FIG. 8) orthogonal to the bar 41 and which is of the same shape as the bar 41.

The bar 41 is formed in a first housing 45 and the bar 42 is formed in a second housing 47. The bar 41 and housing 45 is the same as bar 42 and the housing 47 except that one is rotated 90° with respect to the other so that the bars are orthogonal. Hence only the housing 45 will be described.

Figure 9:
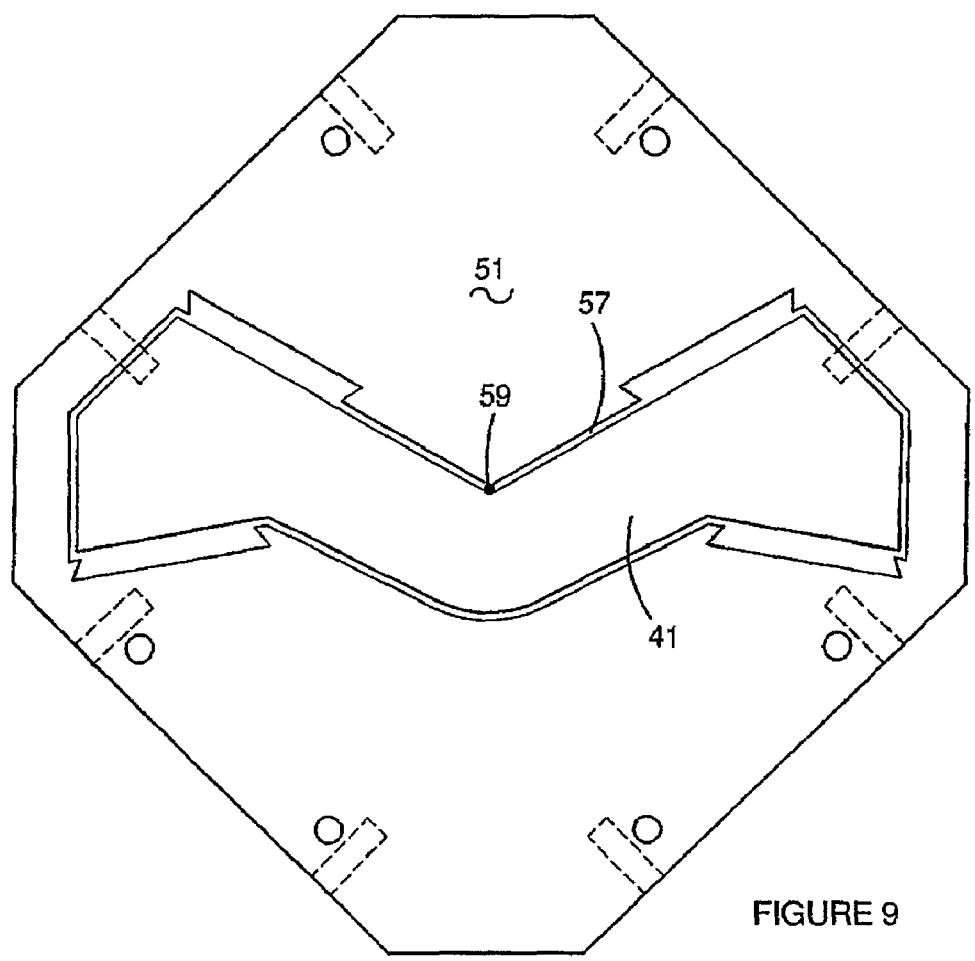
FIG. 9 is a plan view of a bar of the preferred embodiment.

The housing 45 has an end wall 51 and a peripheral side wall 52a. The end wall 51 is connected to rim 75 (FIGS. 2 and 7) of the wall 14 of the first mount 10 by screws or the like (not shown). The bar 41 is formed by a cut 57 in the wall 51 except for a fourth flexure web 59 which joins the bar 41 to the wall 51. The flexure web is shown enlarged in the top view of the bar 41 in FIG. 9. Thus, the bar 41 is able to pivot relative to the housing 45 in response to changes in the gravitational field. The bar 42 is mounted in the same way as mentioned above and also can pivot relative to its housing 47 in response to changes in the gravitational field about a fifth flexure web 59. The housing 47 is connected to base 12 (FIG. 2) of the first mount 10.

The bar 41 and the housing 45 together with the flexure web 59 in this embodiment are an integral monolithic structure. However, the web 59 can be made separate to the housing 45 and connected to the housing 45 and bar 41, as will be described in the embodiment of FIGS. 24 and 25

Transducers 71 (not shown in FIGS. 2 to 6) are provided for measuring the movement of the bars and for producing output signals indicative of the amount of movement and therefore of the measurement of the differences in the gravitational field sensed by the bars.

Figure 10:
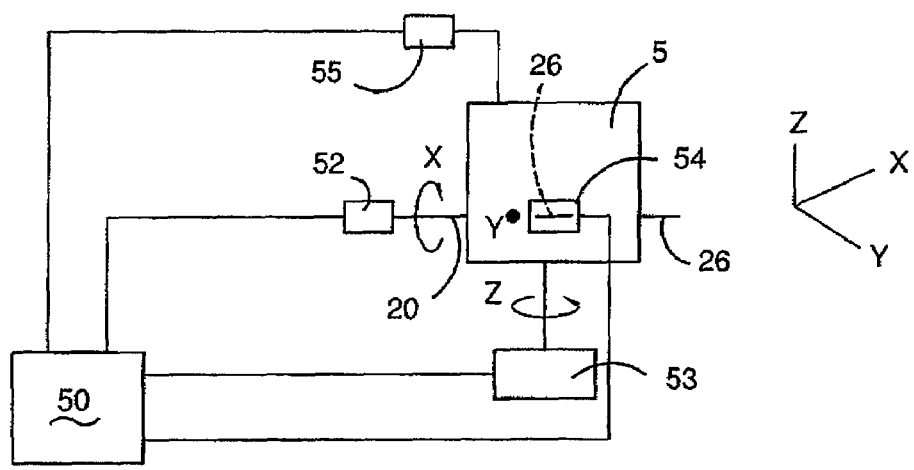
FIG. 10 is a diagram showing actuator control.

FIG. 10 is a schematic block diagram showing actuator control to stabilise the gradiometer by rotating the mounting 5 about three orthogonal axes (x, y, z). A controller 50 which may be a computer, microprocessor or the like outputs signals to actuators 52, 53, 54 and 55. The actuator 52 could rotate the mounting 5 about the x axis, the actuator 54 could rotate the mounting 5 about the y axis and the actuator 54 could rotate the mounting 5 about the z axis. However, in the preferred embodiment, two of the four actuators 52, 53, 54 and 55 are used to rotate the mounting about each axis so that rotation about each axis is caused by a combination of two linear movements provided from two actuators. The linear movement provided by each actuator will be described with reference to FIGS. 31 and 32. The position of the mounting 5 is monitored so that appropriate feedback can be provided to the controller 50 and the appropriate control signals provided to the actuators to rotate the support 10 as is required to stabilise the support during movement through the air either within or towed behind an aircraft.

The preferred embodiment also includes angular accelerometers which are similar in shape to the bars 41 and 42 but the shape is adjusted for zero quadrupole moment. The linear accelerometers are simple pendulous devices with a single micro pivot acting as the flexural hinge.

Figure 11:
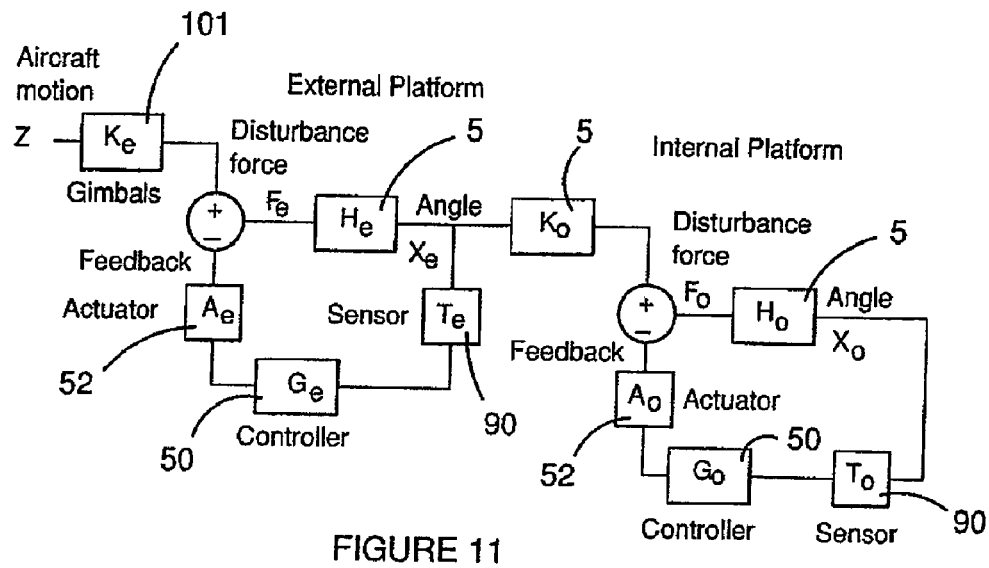
FIG. 11 is a block diagram showing operation of the rotatable support system.

FIG. 11 is a view of a feedback control used in the preferred embodiment.

Figure 12:
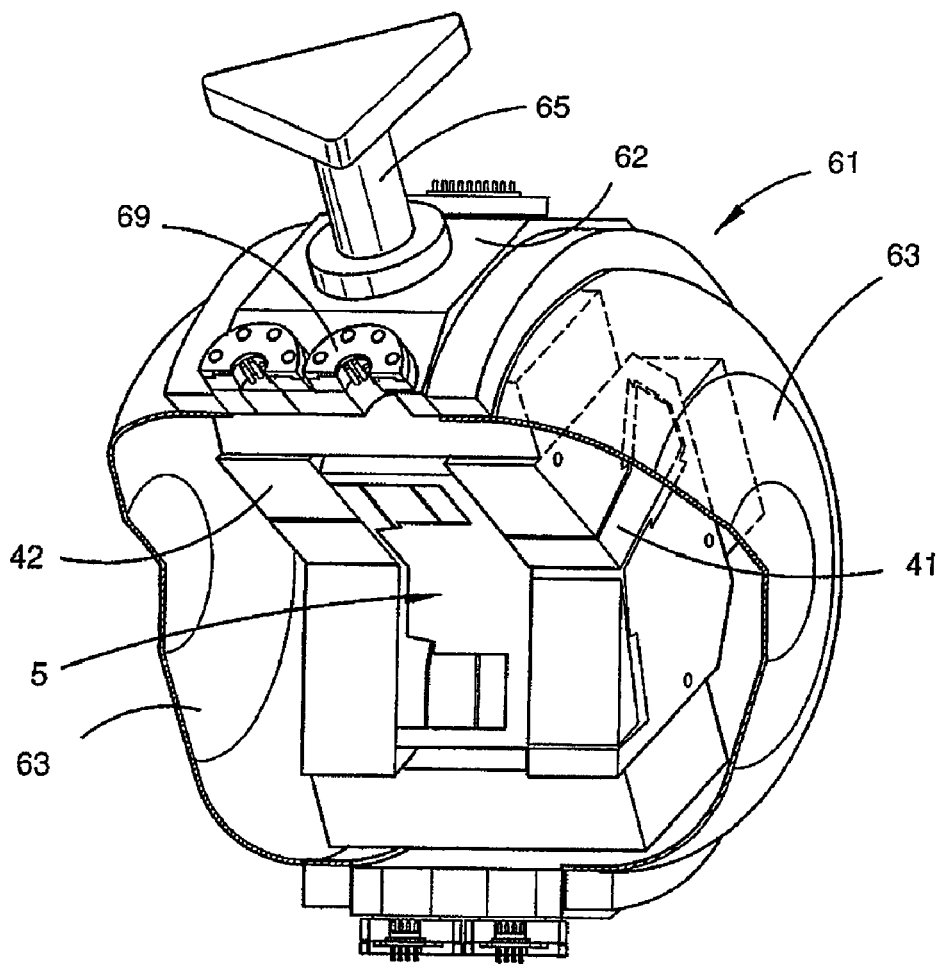
FIG. 12 is a view of a gradiometer of the preferred embodiment.

FIG. 12 is a cut away view of the gradiometer ready for mounting in the Dewar 1 for cryogenic operation which in turn is to be mounted in the external platform. Although FIGS. 2 to 8 show the gradiometer with the bars 41 and 42 top and bottom, the instrument is actually turned on its side (90°) so that the bars 41 and 42 are at the ends as is shown in FIG. 12.

FIG. 12 shows the mounting 5 arranged within the casing 61 and formed by the ring 62 and the transparent hemispherical ends 63. The ring 22 has connectors 69 for connecting the internal wiring from transducers 71 (see FIG. 8) and SQuID (Superconducting Quantum Interference Device) Electronics located in the casing 61 to the connectors 5b (FIG. 1).

The transducers 71 measure the angle of displacement of the bars 41 and 42 and the control circuitry (not shown) is configured to measure the difference between them.

Error correction can be performed numerically based on digitised signals from the accelerometers and a temperature sensor.

The transducers 71 are SQuID based transducers and the error correction is made possibly by the large dynamic range and linearity of the SQuID based transducers.

FIGS. 13 to 21 show a second embodiment in which like parts indicate like components to those previously described.

Figure 19:
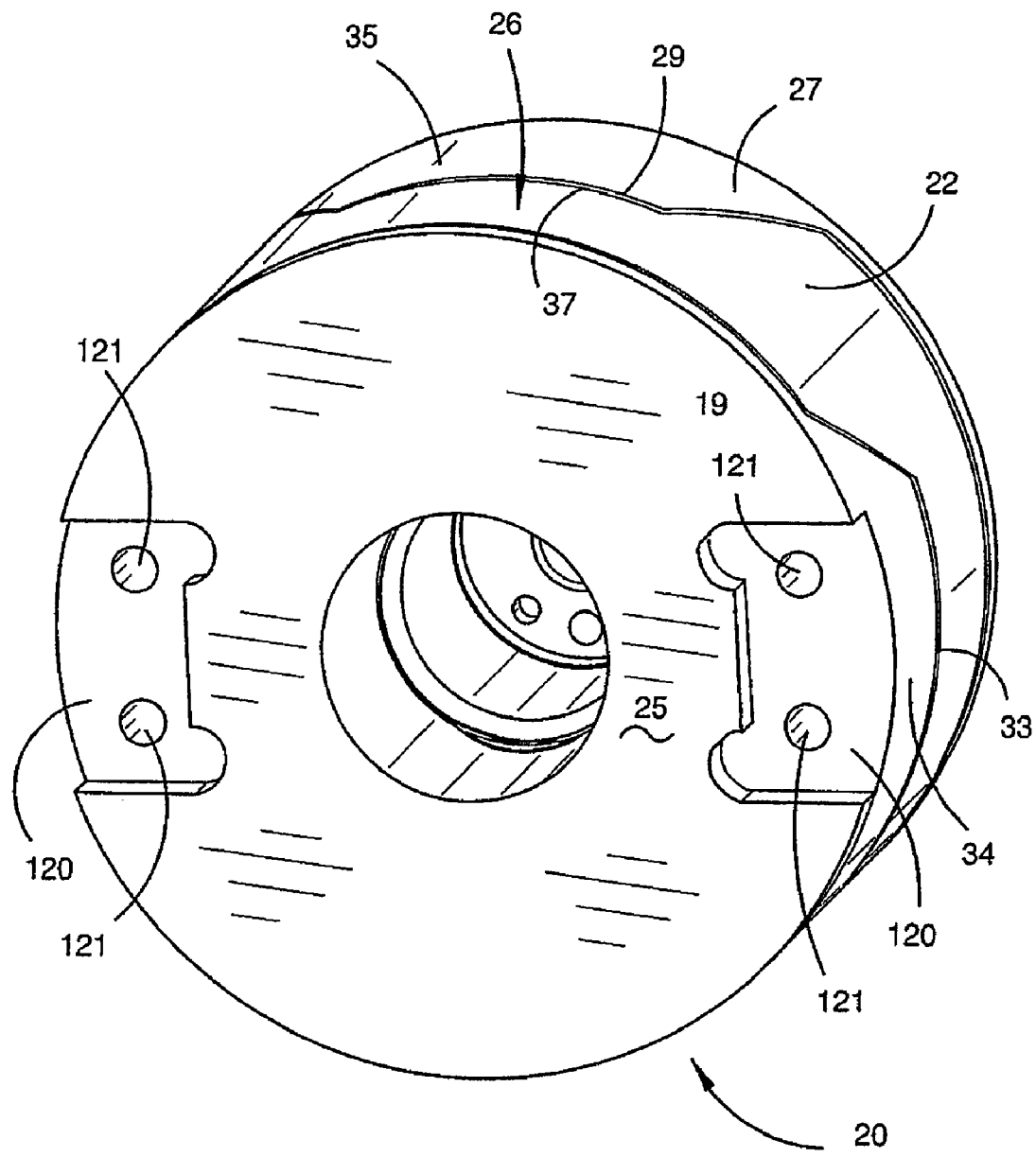
FIG. 19 is a view from beneath of the second mount of the second embodiment.
Figure 20:
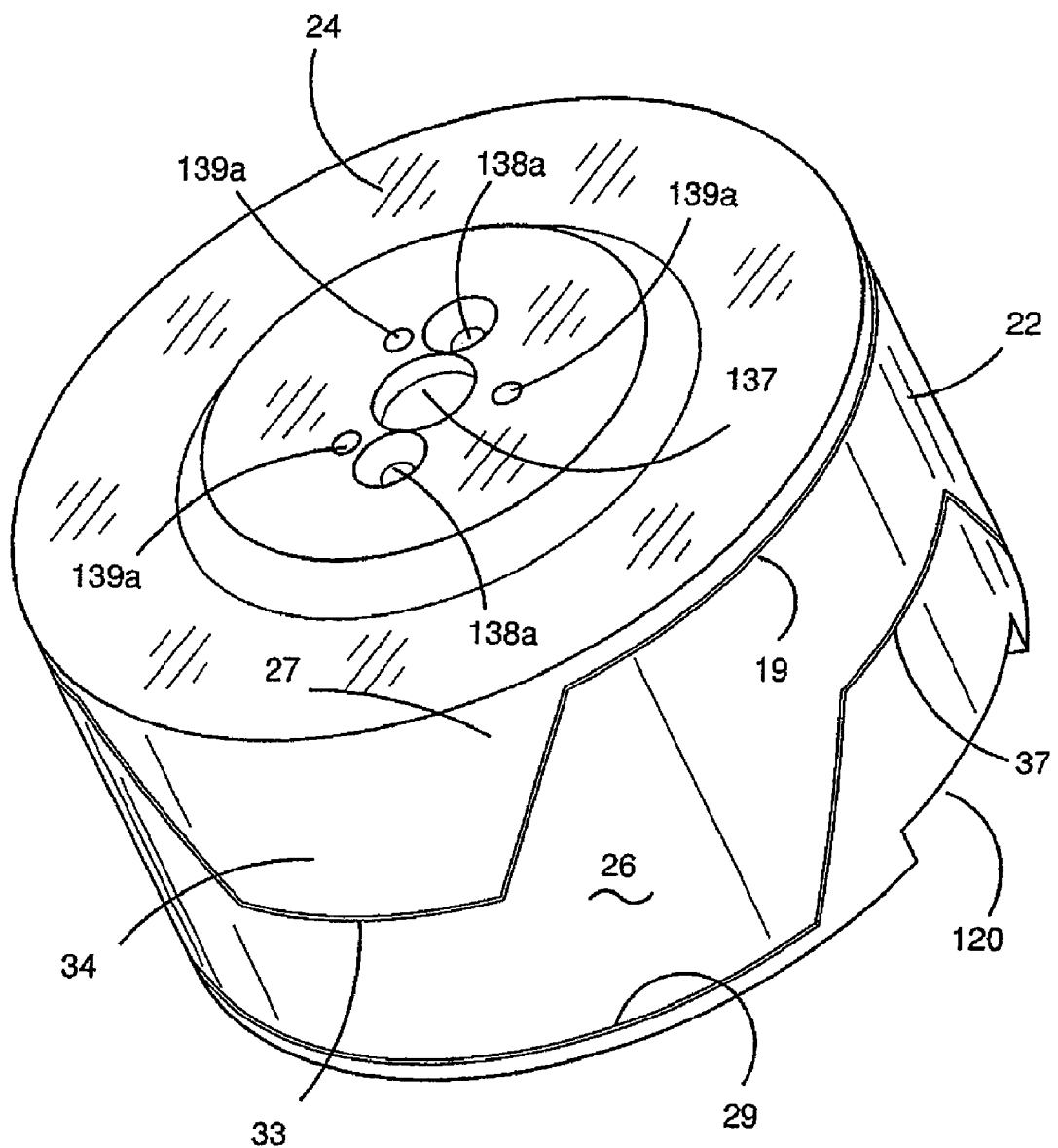
FIG. 20 is a view of the second mount of FIG. 19 from above.
Figure 21:
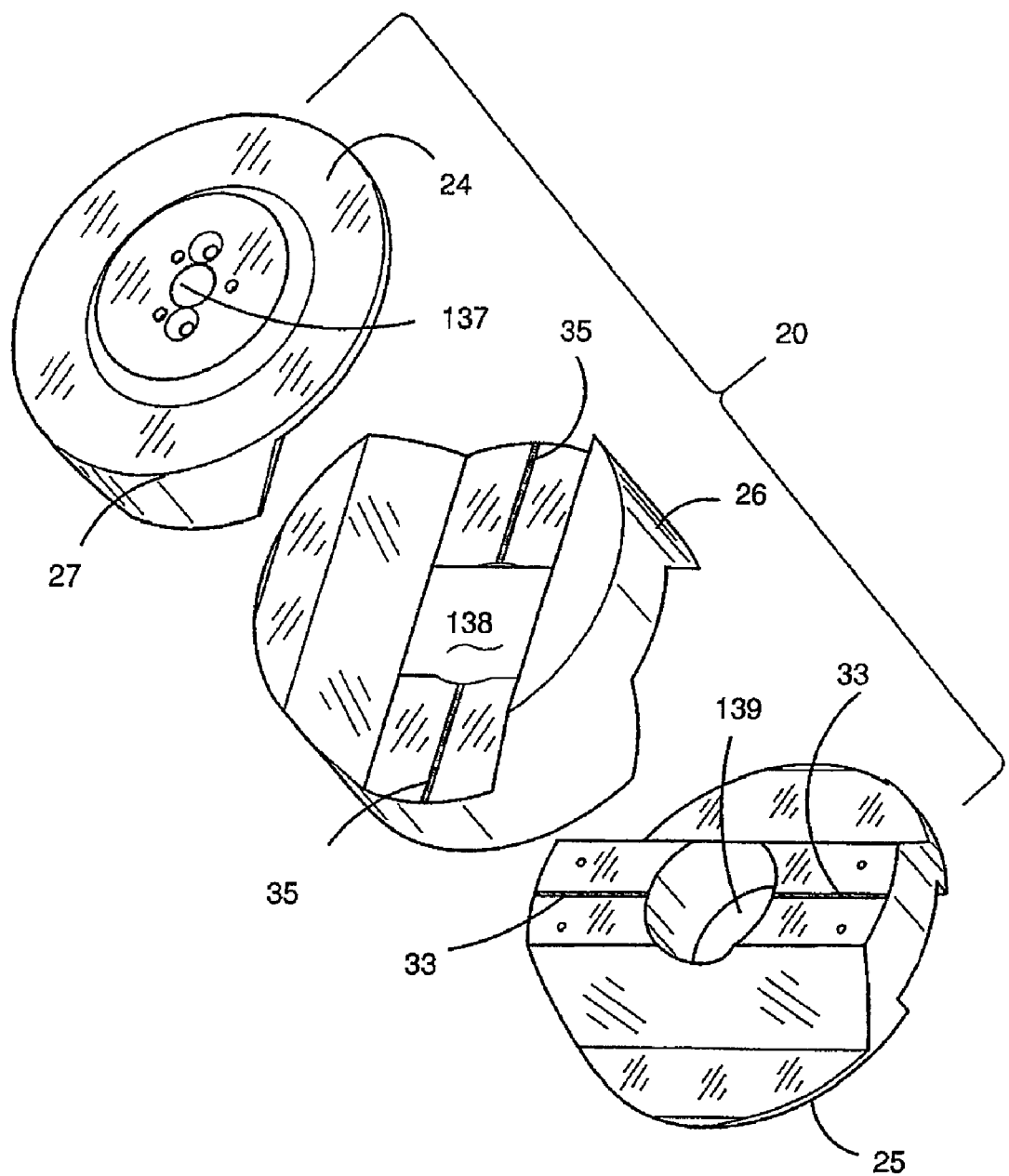
FIG. 21 is an exploded view of the second mount of the second embodiment.

In this embodiment the first mount 10 has cut-outs 80 which effectively form slots for receiving lugs (not shown) which are connected to the mount 10 in the cut-outs 80 and also to the second mount 20 shown in FIGS. 19 to 21. In this embodiment the lugs are separate components so that they can be made smaller, and more easily, made than being cut with the second mount section 20 which forms the second flexure web 33 and the third flexure web 37.

Figure 13:
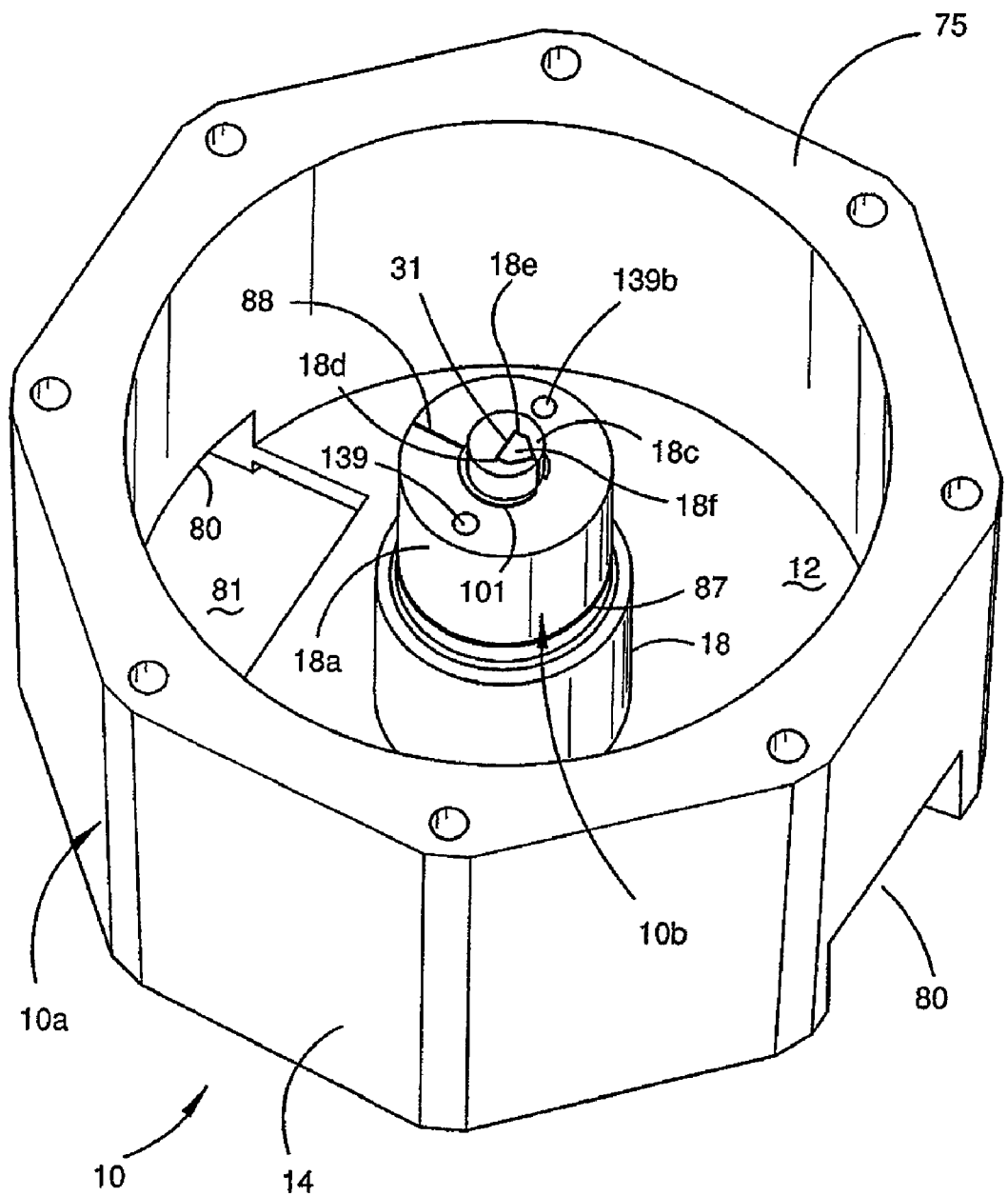
FIG. 13 is a view of a first mount of a second embodiment.

In FIG. 13 a cut 87 is made to define the part 18a of the hub 18. The cut 87 then extends radially inwardly at 88 and then around central section 18c as shown by cut 101. The cut 101 then enters into the central section 18c along cut lines 18d and 18e to define a core 18f. The core 18f is connected to the central section 18c by the flexural web 31 which is an uncut part between the cut lines 18e and 18d. The part 10a therefore forms a primary mount portion of the mount 10 which is separated from a secondary mount portion 10a of the mount 10 except for where the portion 18a joins the portion 10a by the flexural web 31. The part 18a effectively forms an axle to allow for rotation of the part 18a relative to the part 10a in the z direction about the flexure web 31.

Figure 14:
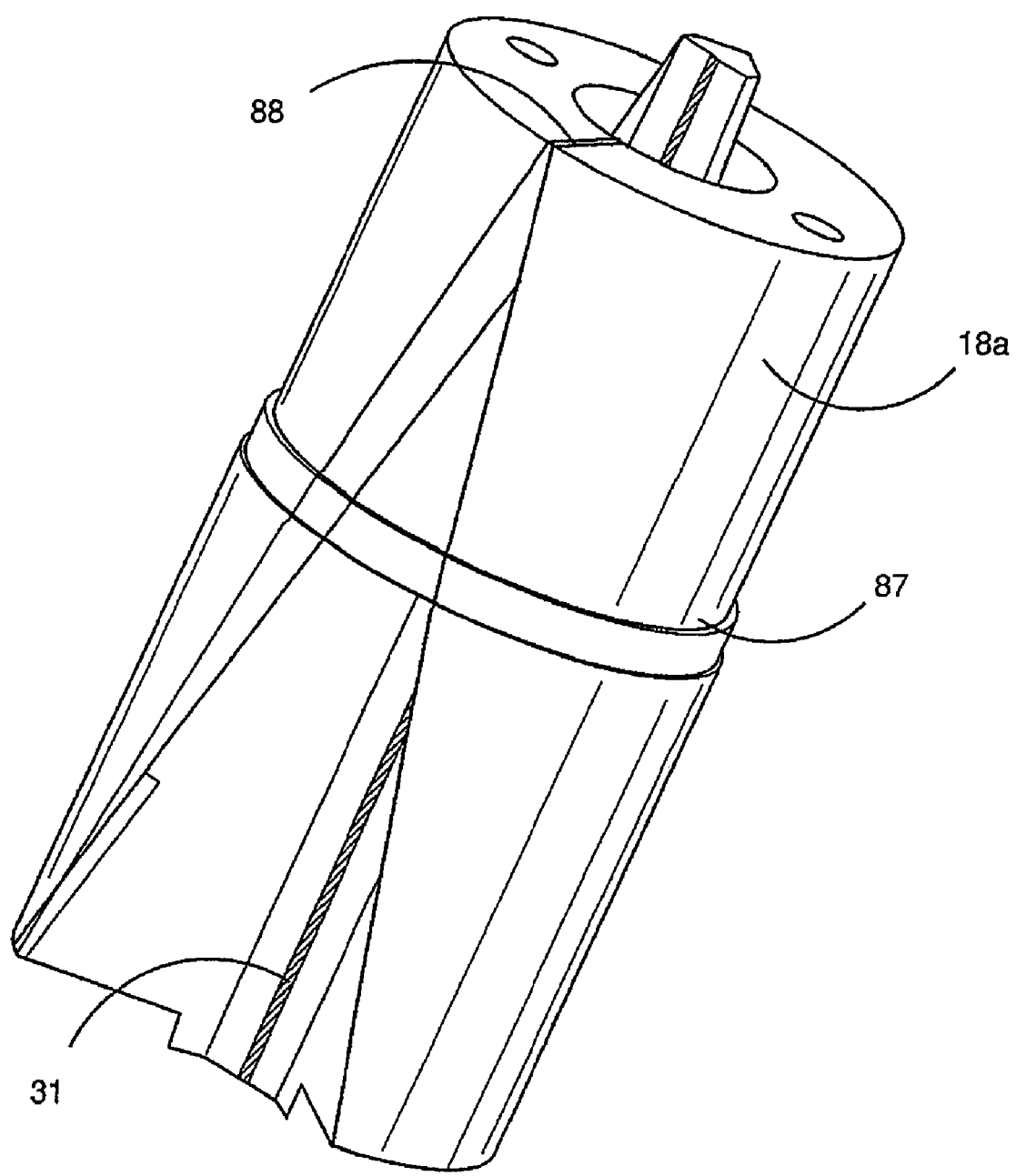
FIG. 14 is a view of part of the mounting of FIG. 13 to illustrate the location and extent of the flexural web of the first mount.
Figure 15:
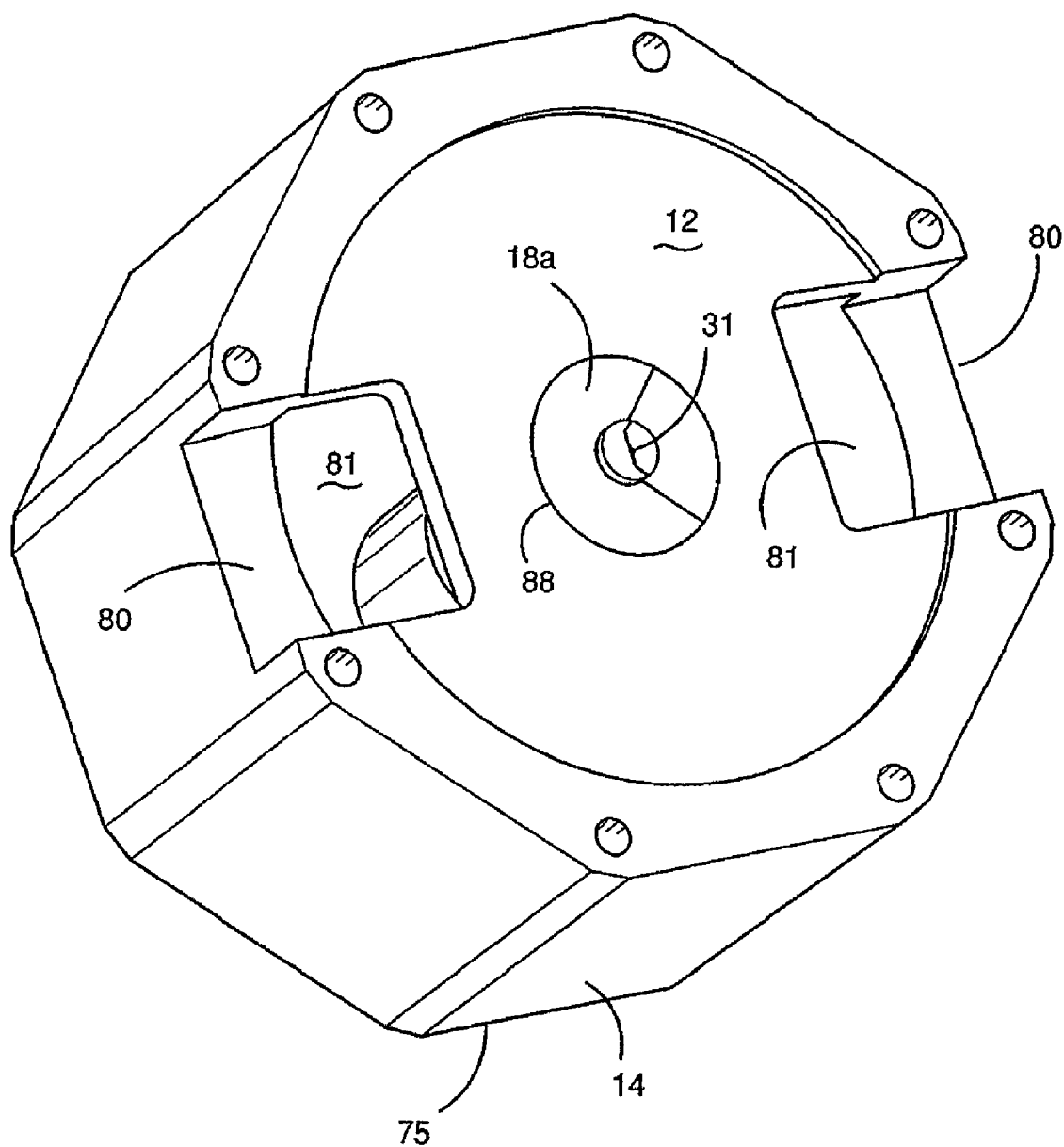
FIG. 15 is a view of the mounting of FIG. 13 from beneath.
Figure 17:
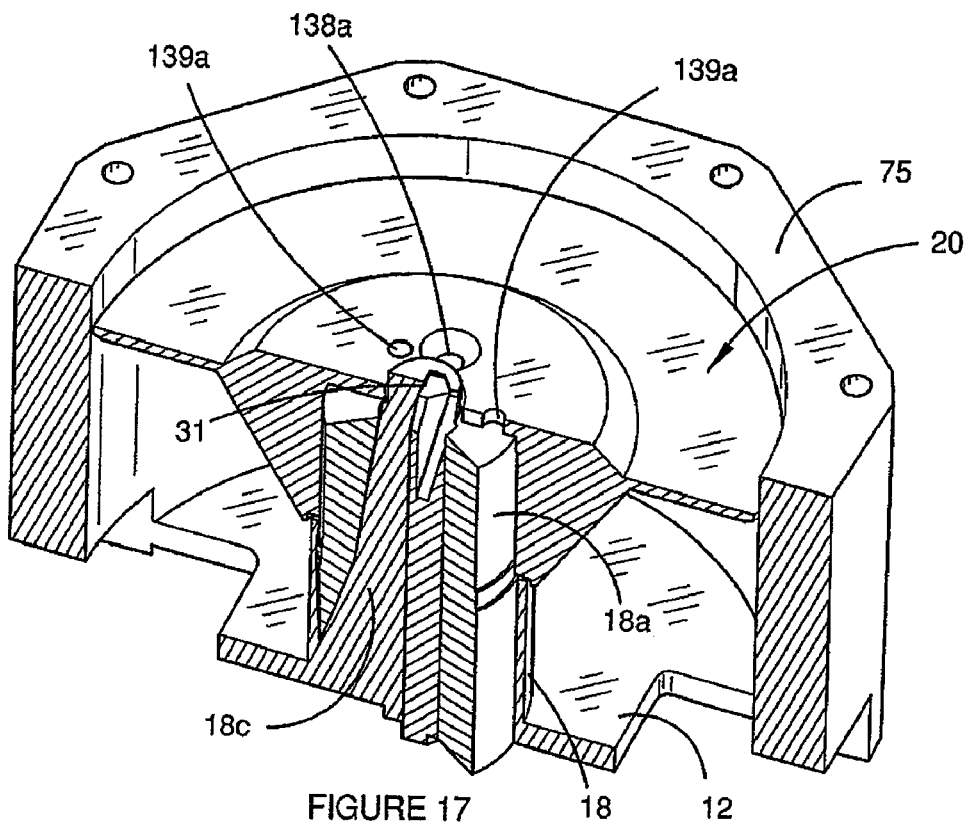
FIG. 17 is a cross-sectional view through the assembly shown in FIG. 16.
Figure 18:
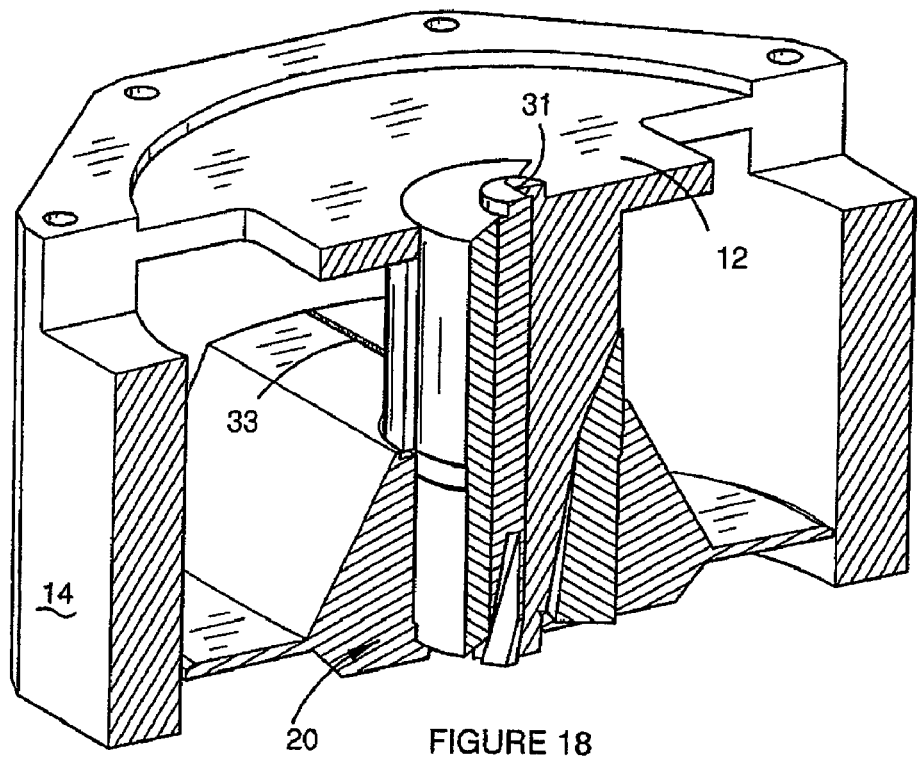
FIG. 18 is a view from beneath of the section shown in FIG. 17.

As is shown in FIG. 14, the cut line 88 tapers outwardly from the upper end shown in FIG. 14 to the lower end and the core 18c tapers outwardly in corresponding shape, as best shown in FIG. 17.

As is apparent from FIGS. 13 to 18, the first mount 10 is octagonal in shape rather than round, as in the previous embodiment.

Figure 16:
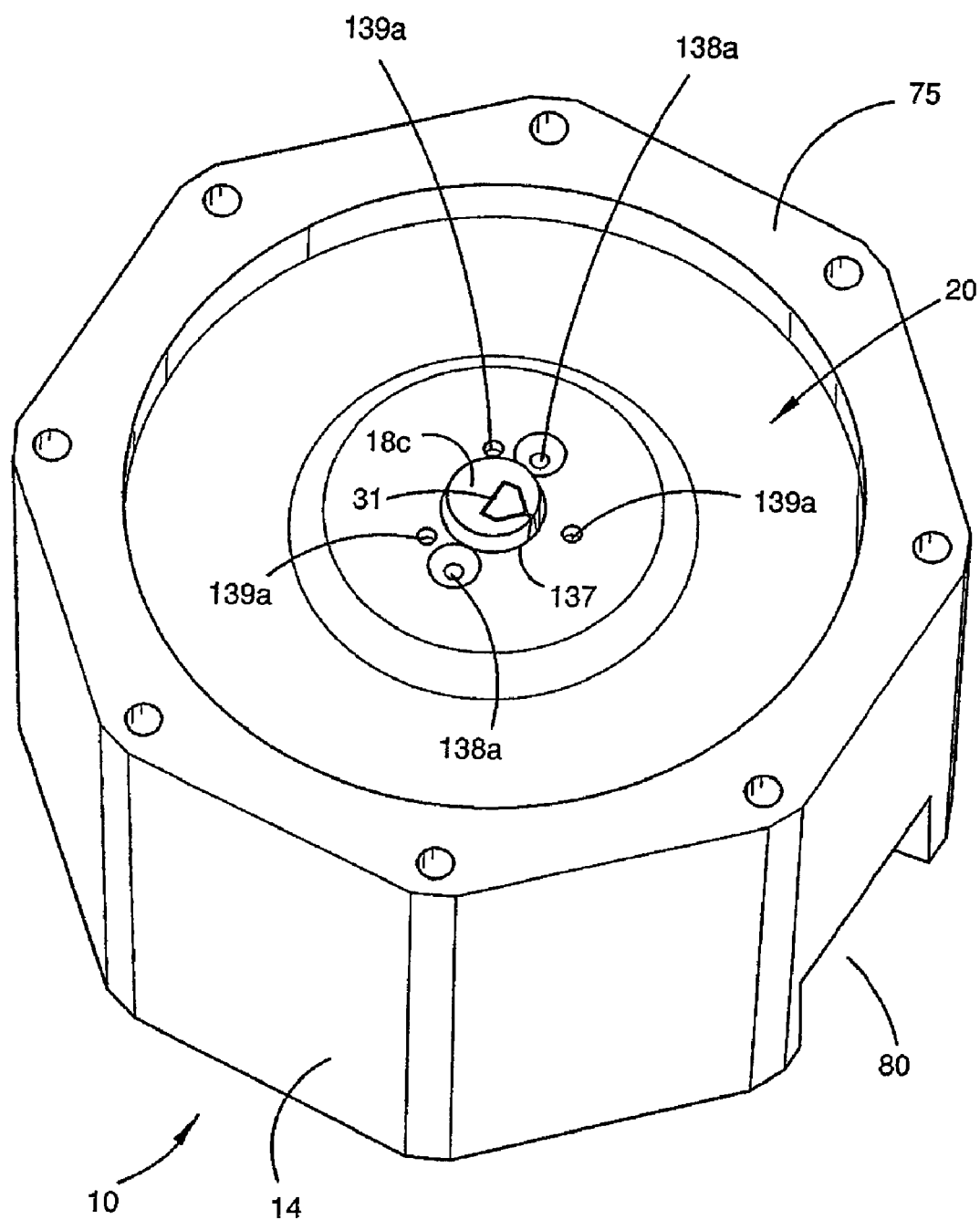
FIG. 16 is a view of the mounting of FIG. 13 including a second mount of the second embodiment.

FIGS. 19 to 21 show the second mount 20. FIG. 16 shows the second mount 20 mounted in the first mount 10. As is best shown in FIGS. 19 and 20, the second mount 20 has cut-outs 120 which register with the cut-outs 80 for receiving lugs (not shown). The lugs can bolt to the second mount 20 by bolts which pass through the lugs and into bolt holes 121. The lugs (not shown) are mounted to the mount 20 before the mount 20 is secured to the first mount 10.

In the embodiment of FIGS. 19 and 20, the peaks 34 and inverted peaks 35 are flattened rather than of V-shape as in the previous embodiment.

In this embodiment, top wall 24 is provided with a central hole 137 and two attachment holes 138a. Three smaller holes 139a are provided to facilitate pushing of the housing 45 off the part 18a if disassembly is required. When the second mount 20 is located within the first mount 10, the upper part of central section 18c projects through the hole 137, as best shown in FIG. 16. The mount 20 can then be connected to the mount 10 by fasteners which pass through the holes 138 and engage in holes 139b (see FIG. 13) in the part 18a.

Thus, when the first housing 45 and its associated bar 41 is connected to the rim 75 of the housing 10 and the second housing 47 is connected to the base 12, the housings 45 and 47 and their associated bars 41 and 42 are therefore able to move about three orthogonal axes defined by the flexure web 31, the flexure web 33 and the flexure web 37.

As is best seen in FIG. 21 which is an exploded view of the three parts 25, 26 and 27 which make up the second mount 20, an opening extends through the mount 20 which is formed by the hole 137, hole 138 and hole 139. It should be understood that the mount 20 shown in FIG. 21 is a monolithic structure and is merely shown in exploded view to clearly illustrate the location of the flexural webs 33 and 35. Obviously the flexural web 33 shown in FIG. 21 joins with the part 26 and the flexural web 35 shown in FIG. 21 joins with the part 27. The holes 137, 138 and 139 define a passage through which the axle or first portion 18a of the first mount 10 can extend when the second mount 20 is located in the first mount 10.

Thus, when the second mount 20 is fixed to the part 18a, the second mount 20 can pivot with the first portion 10a of the first mount 10 about a z axis defined by the flexure web 31 whilst the second portion formed by the part 18a remains stationary. Movement about the x and y axes is achieved by pivotal movement of the second mount 20 about the flexure webs 33 and 35 as previously described.

Figure 22:
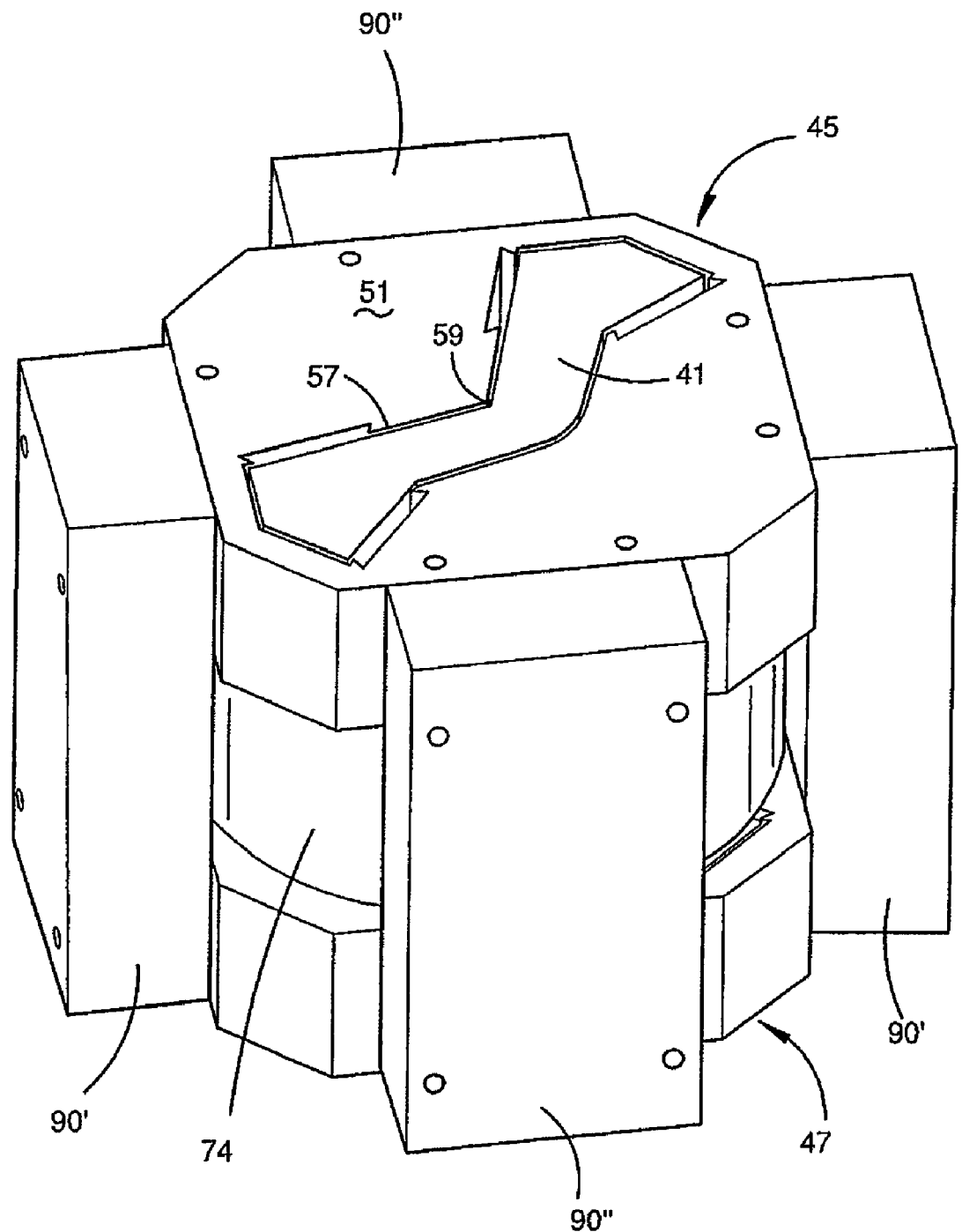
FIG. 22 is view of the assembled mounting and sensors according to the second embodiment.

FIG. 22 shows the linear and annular accelerometers 90 fixed to the housings 45 and 47.

The gravity gradient exerts a torque on a rigid body with any mass distribution provided it has a non-zero quadrupole moment. For a planar body, in the x-y plane and pivoted about the z-axis, the quadrupole is the difference between moments of inertia in the x and y directions. Thus a square or circle has zero quadrupole moment, while a rectangle has a non-zero value.

The torque produced is what constitutes the signal measured by the gradiometer.

There are two dynamical disturbances which can also produce torques and consequently are sources of error.

The first is linear acceleration.

This produces a torque if the center of mass is not exactly at the center of rotation—i.e. the bar is "unbalanced". The bars 41 and 42 are balanced as well as possible (using grub screws to adjust the position of the center of mass) but this is not quite good enough, so there is a residual error. This error can be corrected by measuring the linear acceleration and using this to numerically subtract away the erroneous part of the signal.

The second is angular motion.

There are two aspects to angular motion, each of which produces a different error.

The first is aspect angular acceleration.

Angular acceleration produces a torque on the mass distribution through its moment of inertia (even if the quadrupole moment is zero). This is an enormous error and two preferred techniques are used to counteract it.

The first is to use internal rotational stabilization. This is depicted in the block diagram of FIG. 10. Here Ho(s) represents the sensor assembly pivoted about the mounting 5 (as per FIG. 9). The block A(s) represents the actuator, which provides the feedback torque to effect the stabilization by canceling the applied disturbances. T(s) represents the sensor (or transducer) which measures the effect of the applied disturbance. This is the angular accelerometer. Using angular accelerometers in rotational control is unusual—usually gyros and/or highly damped tilt meters are used, but for our purpose the angular accelerometers are better, as the error is proportional to the angular acceleration disturbance.

The second is to use common mode rejection CMRR—that is why 2 orthogonal bars are needed. For the two bars, the error torque produced by the angular acceleration is in the same direction, but the signal torque produced by the gravity gradient is in opposite direction.

Therefore, by measuring the difference in deflection between the two bars, the gradient is sensed but not the angular acceleration.

Therefore, two separate angular accelerometers 90 (labeled 90' in FIG. 22 for ease of identification) are provided. We have two independent output signals from the pair of OQR bars 41 and 42. The first is proportional to the difference in deflection, which gives the gradient signal and the second is proportional to the sum of their deflections, which is proportional to the angular acceleration and provides the sensor for the z-axis rotational control.

The x and y axes require separate angular accelerometers. Rotational stabilization about these axes is required because the pivot axes of the two bars are not exactly parallel and also to counteract the second form of error produced by angular disturbance, discussed below.

The second aspect is angular velocity.

Angular velocity produces centrifugal forces, which are also a source of error. The internal rotational stabilization provided by the actuators reduces the angular motion so that the error is below 1 Eotvos.

Figure 23:
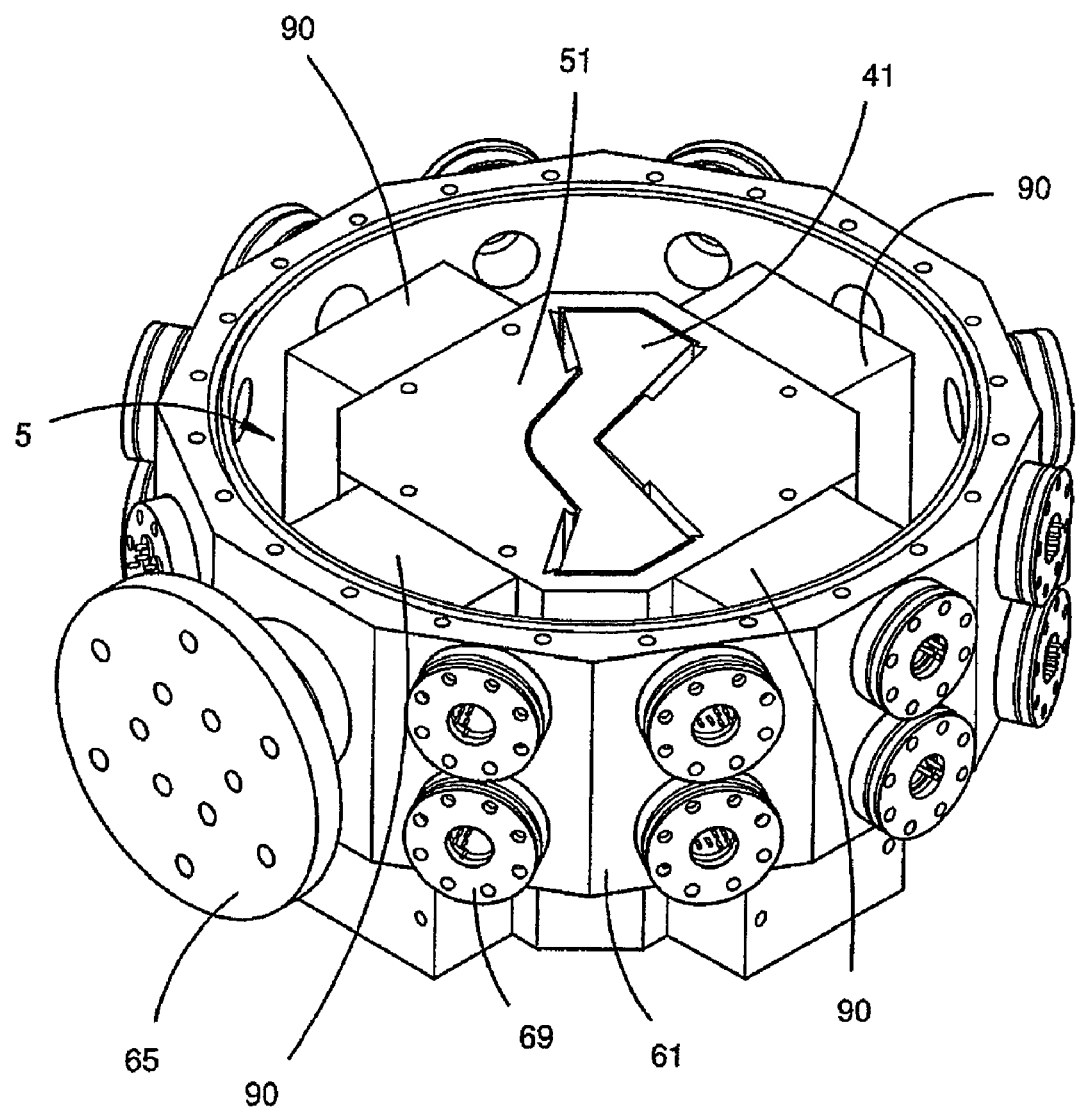
FIG. 23 is a perspective view of the gradiometer with some of the outer vacuum container removed.

FIG. 23 shows main body 61 and connector 69 with the hemispherical ends removed.

Figure 24:
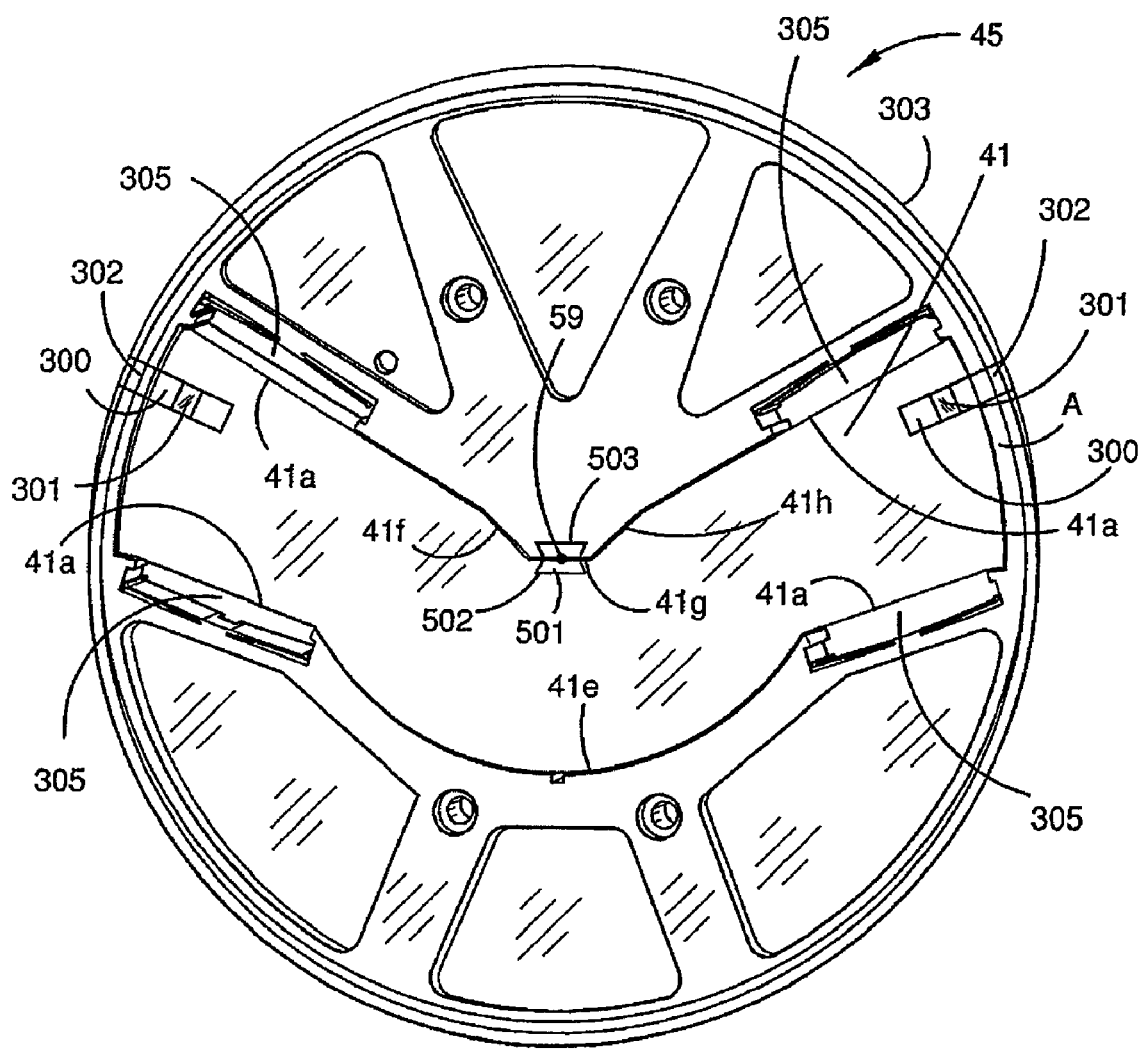
FIG. 24 is a plan view of a housing for supporting a bar according to a further embodiment of the invention.

FIG. 24 is a plan view of housing 45 according to a still further embodiment of the invention. As is apparent from FIG. 24, the housing 45 is circular rather than octagonal, as is the case with the embodiment of FIG. 8.

The housing 45 supports bar 41 in the same manner as described via flexure web 59 which is located at the center of mass of the bar 41. The bar 41 is of chevron shape, although the chevron shape is slightly different to that in the earlier embodiments and has a more rounded edge 41e opposite flexure web 59 and a trough-shaped wall section 41f, 41g and 41h adjacent the flexure web 59. The ends of the bar 41 have screw-threaded bores 300 which receive screw-threaded members 301 which may be in the form of plugs such as grub screws or the like. The bores 300 register with holes 302 in the peripheral wall 52a of the housing 45. The holes 302 enable access to the plugs 301 by a screwdriver or other tool so that the plugs 301 can be screwed into and out of the bore 300 to adjust their position in the bore to balance the mass 41 so the center of gravity is at the flexure web 59.

As drawn in FIG. 24, the bores 300 are a 45° angle to the horizontal and vertical in FIG. 24. Thus, the two bores 302 shown in FIG. 24 are at right angles with respect to one another.

FIG. 24 also shows openings 305 for receiving the transducer 71 for monitoring the movement of the bar 41 and producing signals which are conveyed to the SQUID device. Typically, the transducer is in the form of a coil and as the bar 41 moves slightly due to the gravity difference at ends of the bar, a change in capacitance occurs which alters the current in the coil to thereby provide a signal indicative of movement of the bar 41.

In the embodiment of FIG. 24, the flexure web 59 is not integral with the bar 41 and housing 45 but is rather formed on a separate web element 501.

In this embodiment the bar 41 (and also the bar 42 in the second housing, not shown in FIGS. 24 and 25) are cut separate to the housing 45. The bar 41 is formed with a dove-tail shaped channel 502 and the housing 45 is provided with a correspondingly shaped dove-tail channel 503.

Figure 25:
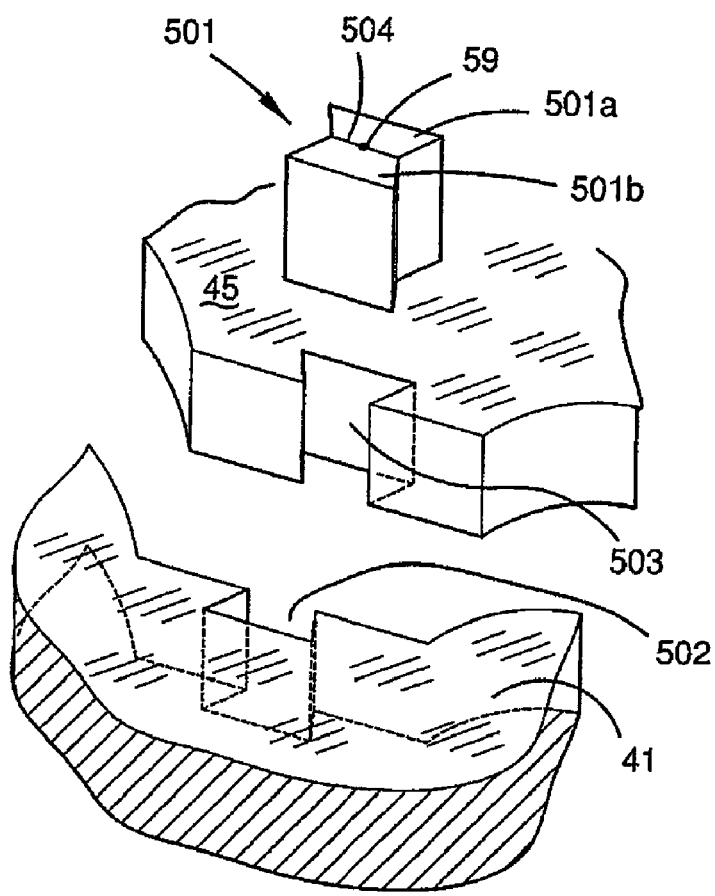
FIG. 25 is an exploded view of part of the embodiment of FIG. 24.

As is best shown in FIG. 25, the web element 501 is of double dove-tail shape having a first dove-tail part 501a and a second dove-tail part 501b which are joined together by the flexure web 59. The parts 501 and 501b are separated by a cut 504 apart from the location of the flexure web 59.

The part 501a is shaped and configured to fit into the channel 503 and the part 501b is shaped and configured to fit into the channel 502. Thus, when the element 501 is located into the channels 502 and 503, the element 501 joins the bar 41 to the housing 45 and provides the flexure web 59 to enable movement of the bar 41 in the housing 45.

In order to secure the element 501 in the channels 502 and 503, the element 501 is cooled to a low temperature so that it effectively shrinks relative to its ambient temperature size. The housing 45 and the bar 41 can be heated so that they expand to increase the size of the channels 502 and 503 relative to their ambient temperature state. Thus, the shrunk element 501 can easily fit into the channels 502 and 503 as a relatively snug fit and when both the element 501 and the bar 41 and housing 45 return to ambient temperature, the housing 41 and bar 45 effectively contract or shrink relative to the element 501 which expands thereby causing the element 501 to tightly lock in the channels 502 and 503.

When the gradiometer is used at cryogenic temperatures, both the element 501 and the bar and housing will experience the same temperature, and therefore temperature difference between that which occurred when the element 501 was fitted into the channels 502 and 503 is maintained to maintain the lock and integrity of the connection of the element 501 to the bar 41 and housing 45.

The use of the element 501 means that the flexure web 59 is formed on a separate component and if the web 59 breaks, the element 501 can simply be removed and replaced by a new element. This therefore avoids the need to replace the entire housing 45 and bar 41 in the event that the flexure web 59 does break.

The flexure webs 31, 33 and 37 could be formed on separate web elements similar to the element 501 instead of being integral with their respective mounting parts to thereby avoid the need to replace the entire mounting part, should one of those webs break.

Figure 26:
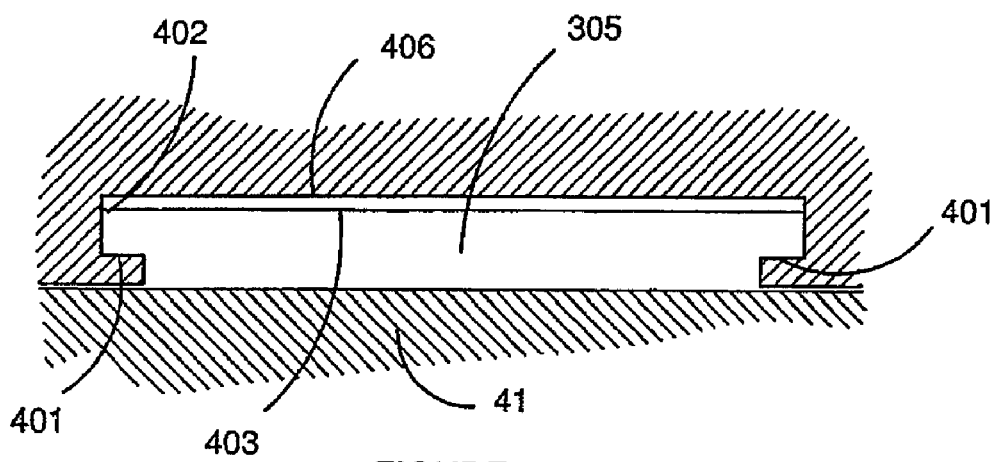
FIG. 26 is a more detailed view of part of the housing of FIG. 24.

FIG. 26 is a more detailed view of part of the housing of FIG. 24 showing the openings 305. As can be seen from FIG. 25, the openings 305 have shoulders 401 which form grooves 402. A spring 403 is arranged adjacent surface 406.

FIGS. 27 to 33 are drawings relating to the transducer 71 used in the preferred embodiments of the invention, which measure the movement of the bars 41 and 42 in the housings 45 and 47. Only one of the transducers is shown in FIGS. 27 to 33.

Figure 27:
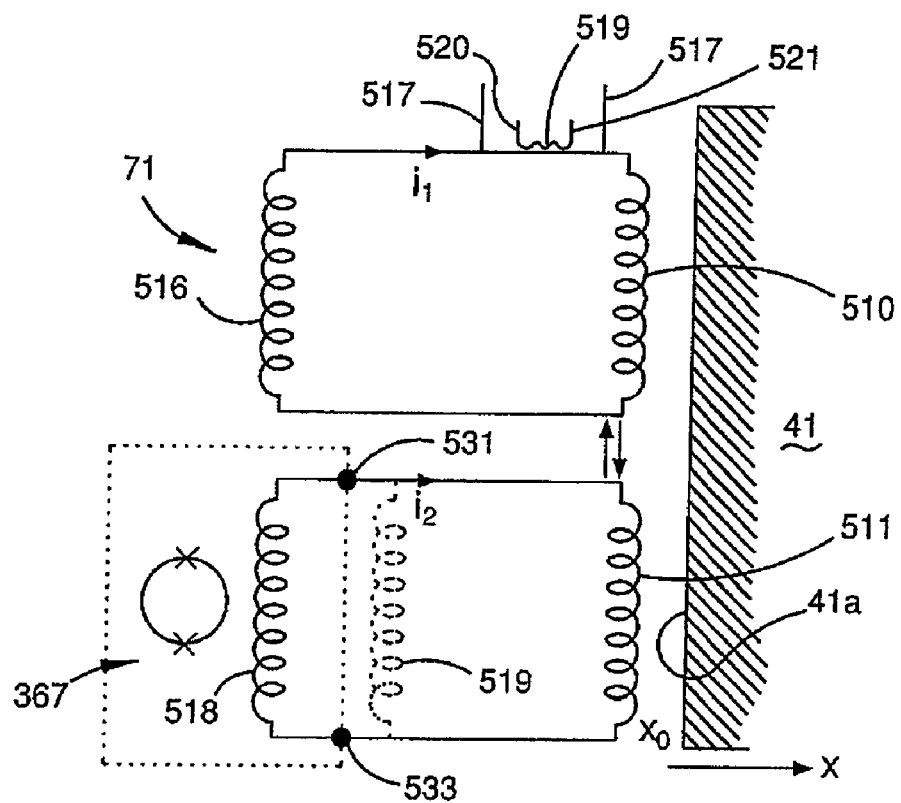
FIG. 27 is a circuit diagram of a transducer used in the preferred embodiment of the invention.
Figure 28:
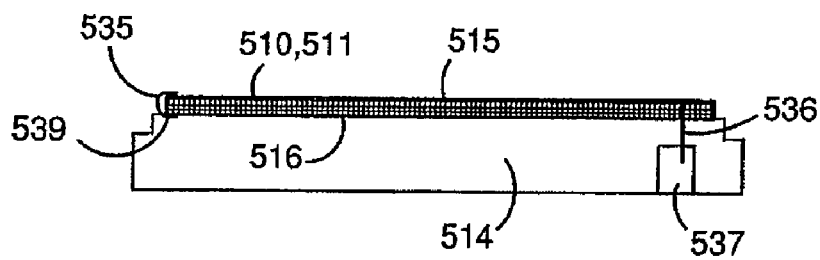
FIG. 28 is a side view of the physical layout of the transducer of the preferred embodiment.
Figure 29:
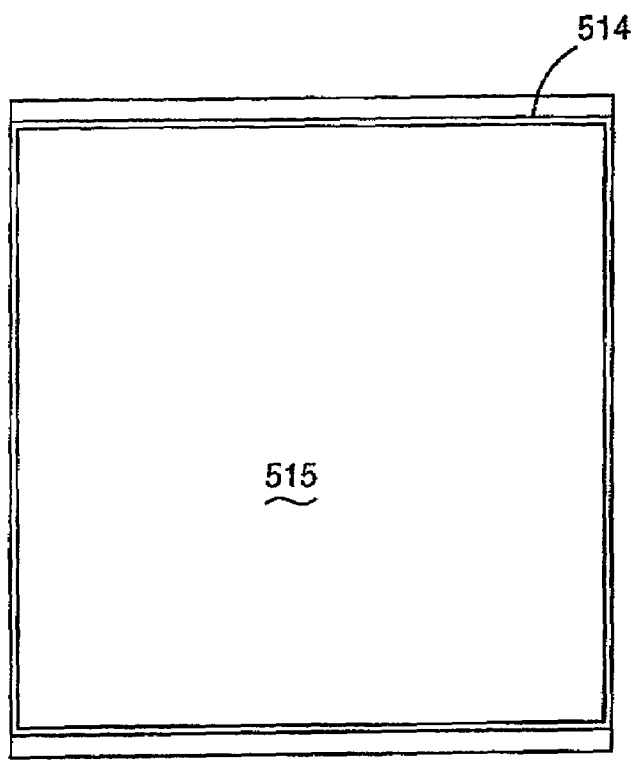
Figure 32:
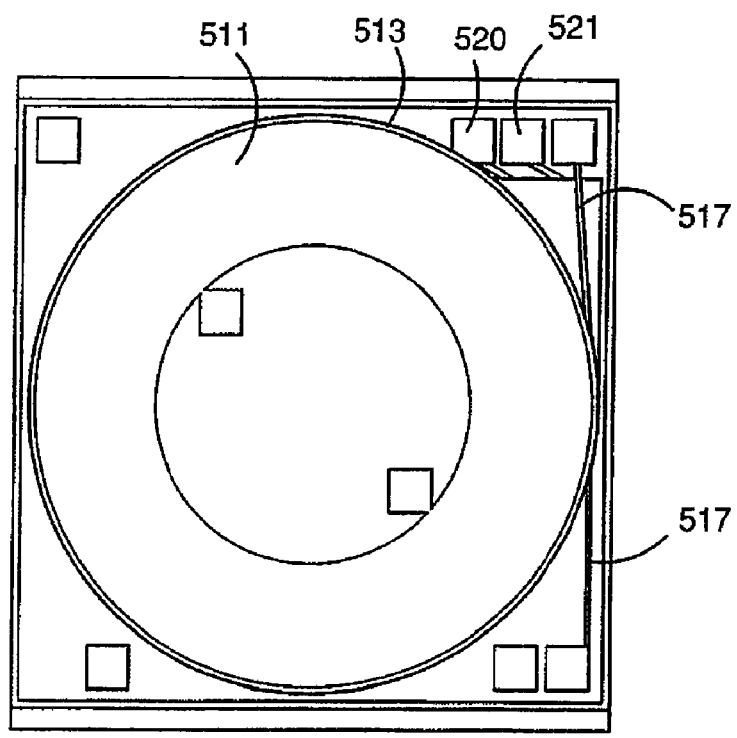

As is shown in FIG. 27 the transducer 70 has two sensing coils 510 and 511 which have their inductance modulated by the motion of superconducting surface 41$a$ of the bar 41, as the bar 41 moves about the flexure web 59 in response to changes in the gravitational field. The coil 510 is a large inductance fine pitch coil with many turns which is intended to carry a relatively low current. The coil 511 is a low inductance coarse pitch pancake coil with fewer turns and is tightly coupled to coil 510 but separated from the coil 510 by a thin insulating layer 513 (which is shown in FIG. 32). The coils 510 and 512 are concentric with one another and are provided on one surface of a Macor block 514 (see FIG. 29) which supports a silicon substrate 515 (FIGS. 28 and 29).

A ballast inductor coil 516 is provided in parallel with the coil 510 and input leads 517 and 518 are provided for inputting an initial current into the loop formed by the coil 510 and the coil 516. The input and output leads are separated by a heat switch 519. The function of the heat switch 519 and leads 517 and 518 will be described in detail hereinafter. Suffice it to say for the present description that the leads 517 and 518 and the switch 519 enable an initial current to be stored in the loop formed by the coils 510 and 516 which will be modulated by movement of the bar 41 during cryogenic operation of the gradiometer to sense changes in the gravitational field.

The coil 516 also provides for tuning of the effective spacing of the coils 510 and 516 from the surface 512, as will be described in more detail hereinafter.

The coil 511 is connected parallel to coil 518 which forms part of the SQUID device 367. A fixed ballast inductor in the form of coil 519 can be provided in parallel with the coils 511 and 518 in order to carry any large currents so those currents do not flow into the SQUID device 367. Provided that the inductance of the coil 519 is much greater than that of the coil 518, the sensitivity is not altered by the inclusion of the fixed ballast inductor 519.

In order to provide a suitable pancake coil for measuring the movement of the surface 512, a large number of turns is required. This makes the formation of conventional coils formed by winding a wire onto a substrate difficult because of the size of the coil and the restraints on size due to its inclusion in the housing 45 and in proximity to the bars 41 in the gravity gradiometer.

To overcome difficulties of manufacture and expense, the sensing coil is formed from a thin film technology so that the coil is an integrated circuit formed on a silicon substrate by suitable masking manufacturing techniques which are well known. However, such thin film technology suffers from the disadvantage of having relatively low current limit requirements. To overcome this drawback the circuit is provided with at least two coils 510 and 511 as described with reference to FIG. 27. The coil 511 effectively amplifies the current in the coil 510 suitable for the SQUID device 367. Thus, the coil 511 effectively forms a transformer to increase the output current of the coil 510. Although this also decreases the effective source inductance, this is not a drawback because using high resolution micro-circuits, it is possible to make coils with many turns and very large inductance.

Figure 30A:
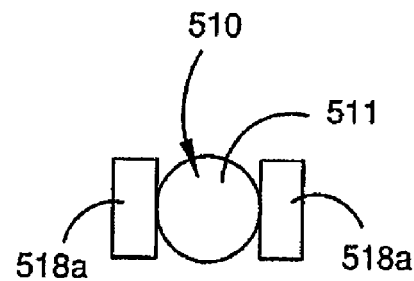
FIGS. 29, 30, 30A, 31, 32 and 33 are a series of diagrams showing the formation of the transducer of the preferred embodiment of the invention.
Figure 30:
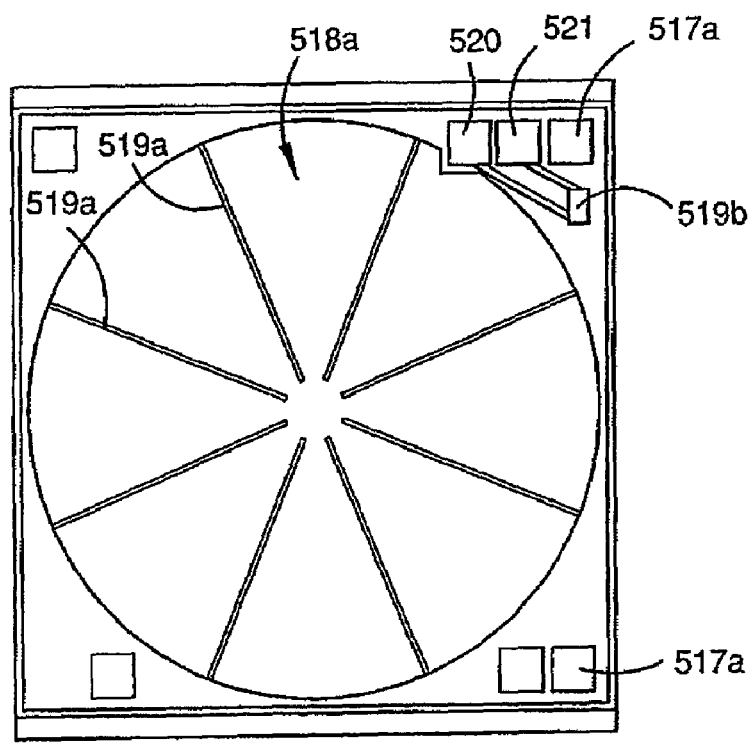
Figure 31:
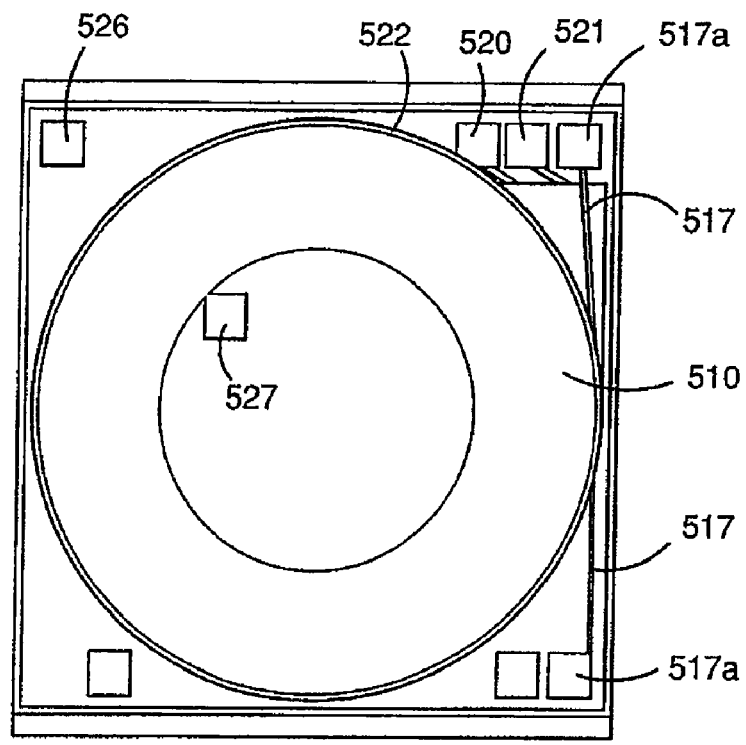

Thus, as shown in FIG. 29 which is a plan view of the Macor block 514 shown in side view in FIG. 28, a silicon substrate 515 is laid on the block 514 and, as is shown in FIG. 30, a circular aluminium capacitor plate 518$a$ is then formed on the silicon substrate 515. The plate 518$a$ is provided with radial slots 519$a$ to reduce circulation of current around the plate 518$a$. Concurrently with formation of the capacitor plate 518$a$, heater switch input 520 and 521 are formed for supplying heater current to the heat switch 519$b$. Input and output pads 517$a$ are also formed for supplying the initial source current which flows through the coil 510 and coil 516. A thin insulating layer 522 is then laid over the capacitor 518$a$, as is shown in FIG. 31. A layer containing the fine coil 510 is then formed on the insulating layer 522, as are input and output leads 517 for supplying the initial current which circulates through the loop formed by the coils 510 and 516. The fine coil 510 is formed from superconducting material such as niobium and may have 1200 turns, a pitch of 5 microns, an outside diameter of 28 μm and an inside diameter of 16 μm.

An insulating layer is then formed over the coil 510. The insulating layer 513 shown in FIG. 32 is then laid over the coil 510 to separate the coil 510 from the coil 511 and the coarse coil 511 is then laid on the insulating layer 513 as shown in FIG. 32.

The coarse coil 511 is also made from superconducting material such as niobium and, for example, has 36 turns with a pitch of 150 microns, and outside and inside diameters which are the same as the fine coil 510.

The ballast coil 516 is provided on the opposite side of the substrate 515 to the coils 510 and 511. This is done by providing two substrates which are about 0.5 mm thick and gluing the two substrates together so that the coil 516 is on the outer opposite surface of the formed substrate to that on which the coils 510 and 511 are deposited. The coil 510 is connected to the coil 516 by bond wires 535 (only one shown in FIG. 28). The Macor block 514 is provided with a slight recess 539 to accommodate the bond wires 535. Bond wires 536 also extend between the substrate 515 and a niobium contact strip 537 formed on the Macor block 514.

Figure 33:
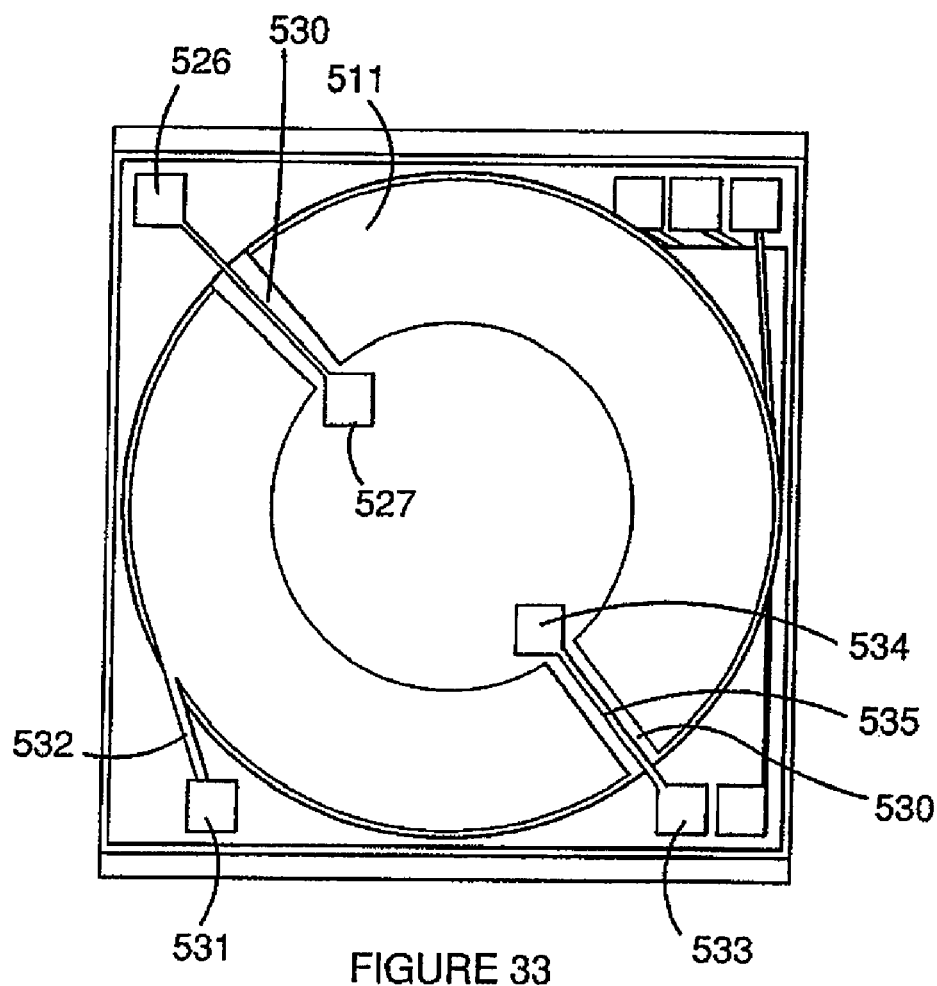

As is shown in FIG. 33, part of the coarse coil 511 is covered by insulating strips 530 to enable interconnection of the coil 511 to the SQUID device 367 such as via pads 531 and lead 532 and pad 533, pad 534 and lead 535.

In the simplest embodiment of the invention the integrated circuit formed by the aforementioned layers may be as simple as comprising the coil 510 and the coil 511, as well as the aluminium capacitor plate 518 all separated by their respective insulating layers.

In this embodiment the arrangement provides good coupling with $K_{12}$ approaching unity. The initial current circulating in the loop formed by the coarse coil 511 and the SQUID device 367 can be set to zero with the sensing flux maintained by the current in the coil 510. Although the current is small, the sensing flux is large because the coil 510 has a large number of turns.

An initial current is stored in the coil 510 (or in the loop formed by the coil 510 and the coil 516) by supplying a current via input lead 517 to the loop. Current is also supplied to the leads 520 and 521 to cause the resistor 519*a* to heat up, thereby heating up the part of the loop shown in FIG. 28 adjacent the heating resistor 519*b* which underlays the lead 517, as shown in FIG. 32, to heat that part of the lead 517 and therefore effectively break the superconducting loop. Current supplied from the leads 517 and 518 can then circulate through the loop and those leads to induce the initial current in the loop. Current is then discontinued to the heating resistor 519*b* and the current induced in the loop continues to circulate in the loop because of the superconducting characteristics of the loop. The current which is induced in the loop is the current which is modulated by movement of the bar 41 relative to the coil 510 so as to change the magnetic flux which is produced which in turn alters the current in the coil 511 which in turn is sensed by the SQUID device 367 to provide a measurement of the change in the gravitational field.

In the embodiment shown in FIGS. 27 and 28 which includes the coil 516, the coil 516, as is previously explained, is mounted on the opposite side of the substrate 515 to the coil 510 and prevents the bias current flowing through the coil 510 from flowing in the external leads 517. The coil 516 is effectively an exact copy of the coil 510 and is preferably therefore also formed from a thin film layer deposited onto the substrate 515. The bond wires 536 which connect to the strips 537 form the connections for enabling the coil 511 to be connected to the SQUID device 367.

The coil 516 may also be used to tune the effective spacing of the coil 510 from the front face 512 of the bar 41 so that all of the transducers which are used can be spaced from the surfaces 512 by the same distance. This will be described in more detail hereinafter, but suffice it to say for the present description that coils 516 and 510 can form a single virtual coil by suitably selecting the current which is induced in the loop formed by the coils 510 and 516. Thus, by changing that current the position of the virtual coil effectively moves between the coils 510 and 516 to provide a virtual coil position which can be located at a predetermined distance from the face 512. By suitably selecting the currents which circulate through the respective loops, tolerances in manufacture and assembly of the device can be overcome to ensure that the virtual coil formed by the coils 510 and 516 are equally spaced from the faces 512 of their respective bars.

Thus, the coil 516 can be used to perform the dual function of avoiding bias currents in the external leads as described above, and also tuning of the effective spacing of the coil 510 from the surface 512.

In the embodiments described above, the capacitor plate 518*a* is concentric with the coils 510 and 511. The capacitor plate 518*a* does not play any part in the operation of the transducer in order to sense changes in the gravitational field. The capacitor plate 518*a* is used to calibrate the balance of the bars 41 and 42 in their respective houses 45 and 47, as will be described in more detail hereinafter. The positioning of the capacitor plate 518*a* as a concentric arrangement with the coils 510 and 511 and substantially coplanar with those coils means that the capacitor plate 518*a* sees the same signal which is seen by the coil (that is, the gap between the surface 512 and the coil 510). Thus, when the capacitor 518 is used to calibrate the balance of the bars 41 and 42, the capacitor is measuring the same effective signal as would be seen by the coils during operation of the gradiometer. This enables the bars 41 and 42 to be balanced relative to the signal which is actually detected by the coils 510 during operation of the device, thereby improving the balancing of the bars 41 and 42 and therefore the operation of the gradiometer.

The plate 518*a* is provided concentric with the coils 510 and 511 in this embodiment by making the plate 518 and the coils 510 and 511 having substantially the same center point. However, in other embodiments the concentric arrangement can be provided by providing the capacitor plate 518*a* as separate platelets concentrically arranged about the center location of the coils 510 and 511 rather than a common center, as shown in FIG. 30A. Different geometrical arrangements are also possible.

Figure 34:
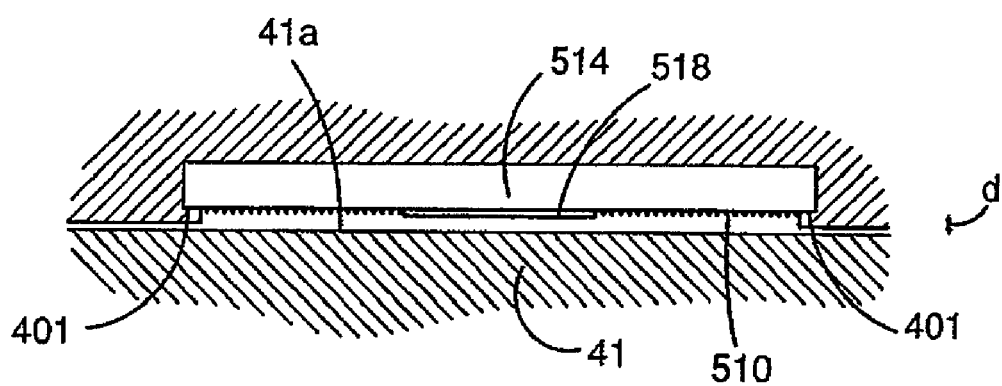
FIG. 34 is a view similar to FIG. 26 but showing the transducer in place.

FIG. 34 shows the location of the block 514 in the opening 305 and the grooves 402 and is biased by the spring 403 against the shoulders 401 to hold the block 514 in place with the coil 510 being adjacent the edge face 41*a* of the bar 41.

Thus, the coil 510 and the bar 41 form an l c circuit so that when the bar 41 moves, the current passing through the coil 510 is changed.

Figure 34A:
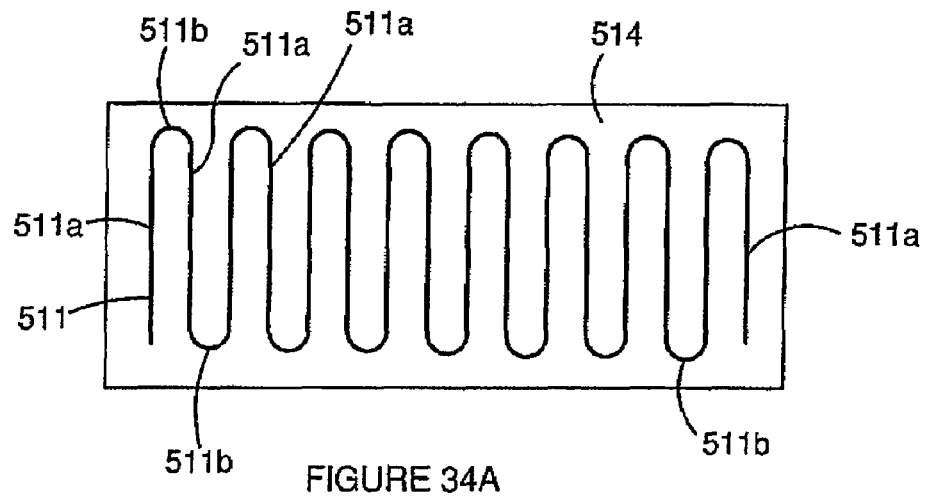
FIG. 34A is a view of a more preferred embodiment of the coil arrangement shown in FIGS. 29 to 33.
Figure 34B:
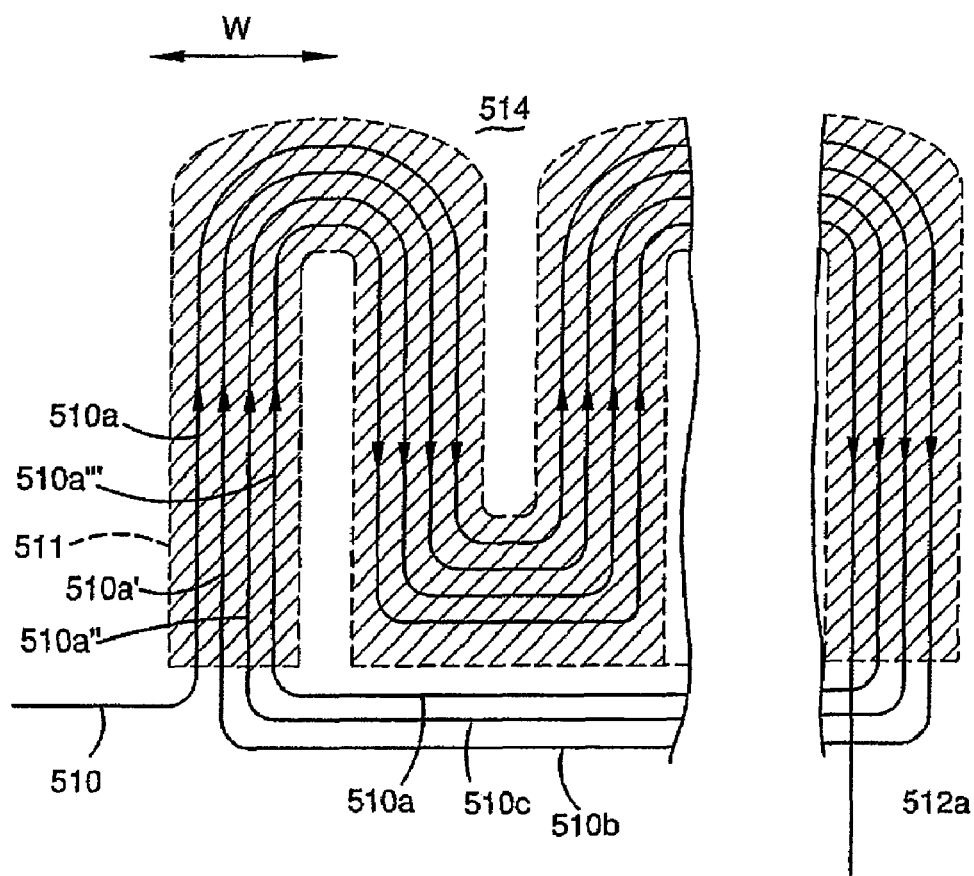
FIG. 34B is a detailed view of part of the arrangement shown in FIG. 34A.

With reference to FIG. 34A and FIG. 34B, a more preferred arrangement of the coils 510 and 511 is shown. In the embodiment previously described the coils 510 and 511 are generally circular pancake type coils. To more easily form the coils and enable interconnection of the coils with other circuit componentry of the gradiometer, the coils 510 and 511 in FIGS. 34A and 34B are meandering coils formed on the block 514 in two separate layers which are separated by insulation as previously described.

As best shown in FIG. 34A the coarse pitch coil 511 meanders in generally curved zigzag fashion and has arms 511*a* which are joined by curved transitions 511*b* at respective alternate ends of the arms 511*a* as shown in FIG. 34A. The fine pitch coil 510 is not shown in FIG. 34A. However, if the fine pitch coil merely follows the meander of the coil 511 so that there are a number of fine pitch meandering arms having current flowing in opposite directions associated with each arm 511*a*, then the current in the arms of the fine pitch coil will simply cancel one another to produce zero net magnetic flux.

The avoid this the fine pitch coil 510 meanders in the manner shown in FIG. 34B relative to the coil 511. The coil 510 has a first arm 510*a* which follows the meandering part of the coil 511 (which is shown in dotted lines in FIG. 34B) to the opposite end of the coil 511*a* then returns along coil section 510*b* to form a further arm 510*a'* which then meanders in the same manner to return along coil part 510*c* to again form a further arm 510*a"*. The coil 510 then returns along circuit part 510*d* to form a still further arm 510*a'''*.

Thus, the current flowing through the arms 510*a* of the coil 510, which overlap the arms 511*a* of the coil 511, is in the same direction as indicated by the arrowheads in each of those arms. Therefore, there is no cancelling of the magnetic flux in each coil 510*a* associated with the overlapped arm 511*a* of the coil 511. Further still, the coil 510 need only cross over itself at one location 512*a* as shown in FIG. 34B in order to provide an output current from the coil 510. The coil part 512*a* can be on a separate layer to the remainder of the coil 510 (for example, the same layer as the coarse pitch coil 511) so that the insulating layer between the coils 510 and 511 separates the circuit part 512*a* from the remainder of the coil 510 shown in FIG. 34B).

The coil 511 is dimensioned such that the width W of the arms 511*a* of the coarse pitch coil is greater than the space d between the surface of the bar 41 and the surface of the block 514 on which the coils 510 and 511 are deposited as shown in FIG. 34.

As will be apparent from FIG. 24, four transducers 71 are arranged adjacent the ends of the bar 41. The other housing 47 also has four transducers arranged adjacent the bar 42. Thus, eight transducers 71 are provided in the gradiometer.

Figure 35:
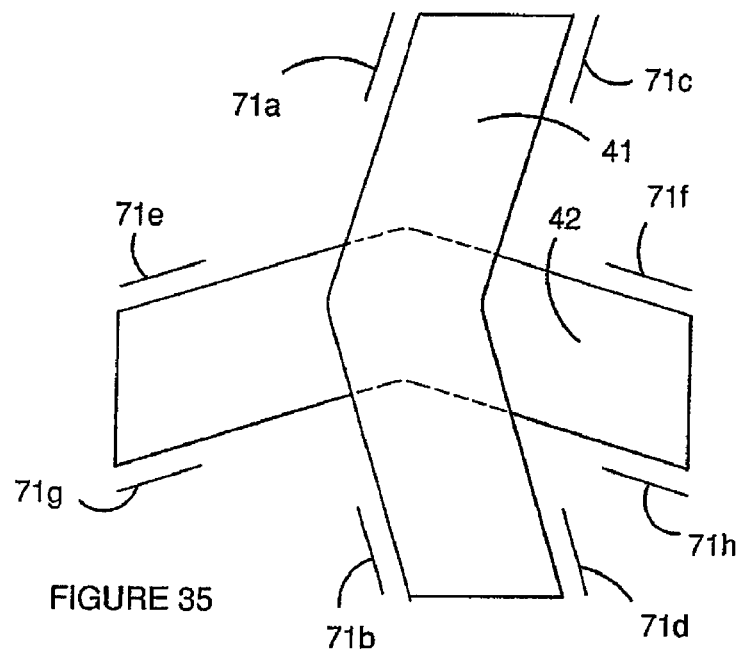
FIG. 35 is a diagram to assist explanation of the circuits of FIGS. 36 and 37.

FIG. 35 is a diagram of the bars 41 and 42 showing them in their "in use" configuration. The transducers which are located in the openings 305 are shown by reference numbers 71a to 71e to equate to the circuit diagrams of FIGS. 36 and 37.

Figure 36:
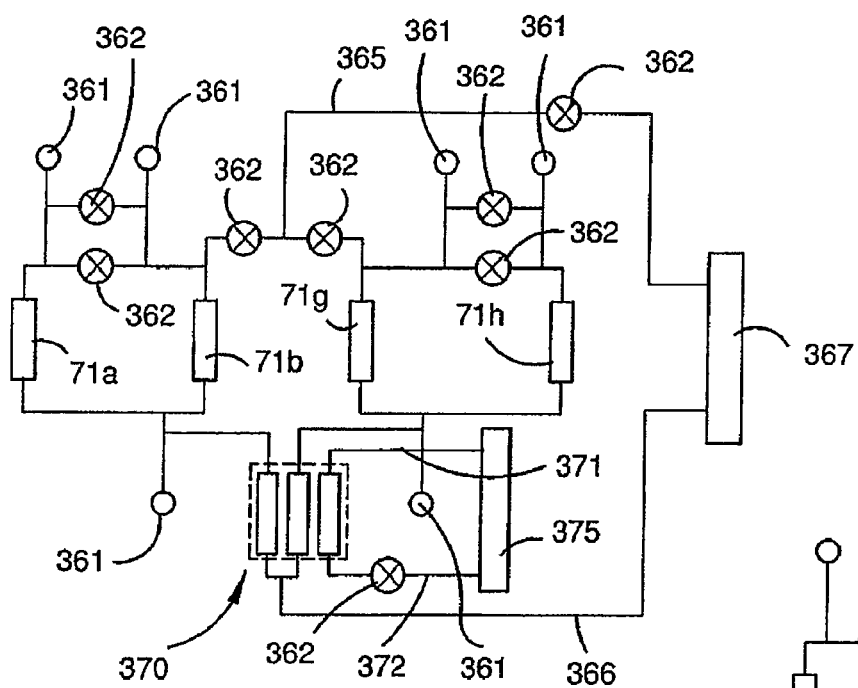
FIG. 36 is a circuit diagram relating to the preferred embodiment of the invention, particularly showing use of one of the sensors as an angular accelerometer.
Figure 37:
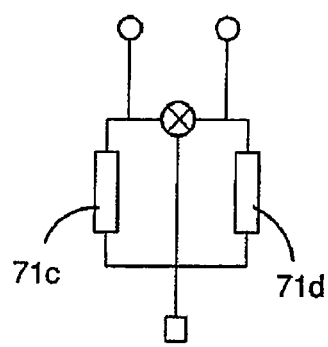
FIG. 37 is a frequency tuning circuit.

With reference to FIGS. 36 and 37, transducers 71a and 71b associated with the bar 41, and transducers 71g and 71e associated with the bar 42 are used to provide the gravity gradient measurements.

Input terminals 361 provide input current to the superconducting circuits shown in FIG. 36. Heat switches which may be in the form of resistors 362 are provided which are used to initially set the superconducting current within the circuit. The heat switches 362 are initially turned on for a very short period of time to heat those parts of the circuit at which the resistors 362 are located to stop those parts of the circuit from superconducting. Currents can then be imposed on the superconducting circuit and when the heat switches formed by the resistors 362 are switched off, the relevant parts of the circuit again become superconducting so that the current can circulate through the circuits subject to any change caused by movement of the bars 41 and 42 under the influence of the gravity gradient and angular acceleration, as will be described hereinafter. The transducers 71a, 71b, 71g and 71e are connected in parallel to circuit line 365 and to circuit line 366 which connect to a SQUID 367.

Thus, as the bars 41 and 42 rotate about their respective flexure web, the bars 41 and 42, for example, come closer to the transducer 71a and therefore further away from the transducer 71b, and closer to the transducer 71h and further away from the transducer 71g respectively. This therefore changes the current flowing through the transducers and those currents are effectively subtracted to provide signals for providing a measure of the gravity gradient.

As is shown in FIG. 37, transducers 71c and 71d form a separate circuit and are used for frequency tuning of the bar 41 and transducers 71a and 71b. Similarly, the transducers 71e and 71f are used for frequency tuning of the bar 42 and the transducers 71g and 71h. Frequency tuning of the bars is important because the bars should be identical in order to reject angular accelerations. The frequency tuning circuits therefore enable electronic tuning of the bars to match resonant frequencies and to achieve mode rejection so that each of the bars does function in an identical manner.

The transducers 71a, 71b, 71g and 71h are also used to form angular accelerometers for measuring the angular movement of the mounting 5 so that feedback signals can be provided to compensate for that angular movement.

To do this, the line 366 is connected to a transformer 370. The polarity of the signals from the transducers 71a and 71b and 71g and 71h are reversed so that the output of the transducer 370 on lines 371 and 372 is an addition of the signals rather than a substraction, as is the case when the gradient is measured so the addition of the signals gives a measure of the angular movement of the bars. The outputs 371 and 372 are connected to SQUID device 375 for providing a measure of the angular acceleration which can be used in the circuit of FIG. 10 to provide compensation signals to stabilise the mounting 5.

Thus, according to the preferred embodiment of the invention, the angular accelerometers 90' provide a measurement of angular acceleration, for example, around the x and y axes, and the angular accelerometer formed by the bars 41 and 42 and the transducers 71a, 71b, 71g and 71h provide a measure of the angular accelerometer around the, for example, z axis.

Figure 38:
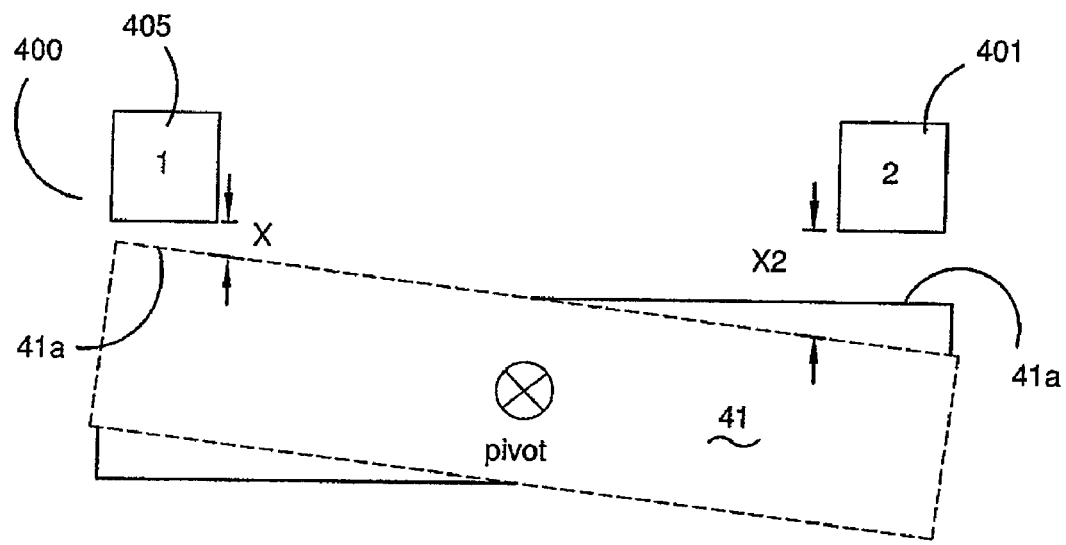
FIG. 38 is a diagram illustrating balancing of the sensors of the gradiometer of the preferred embodiment.
Figure 39:
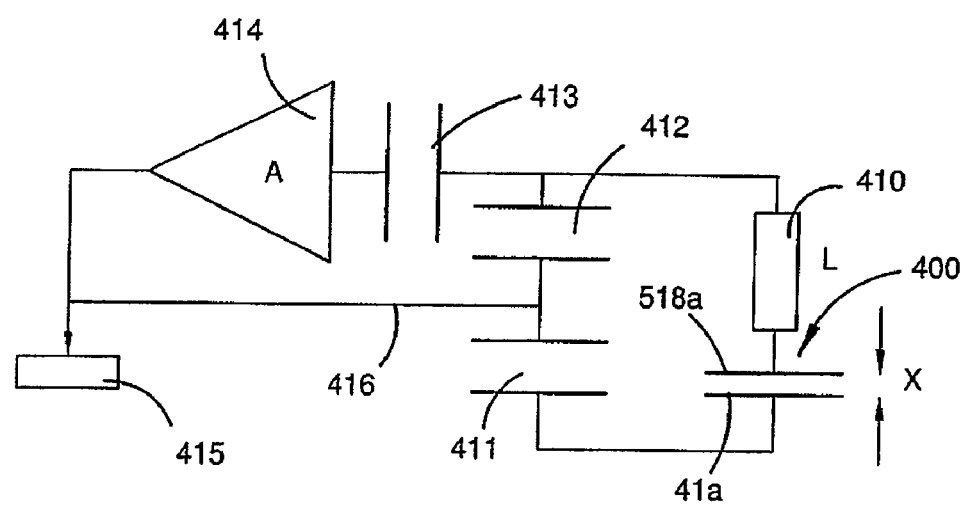
FIG. 39 is a circuit diagram of a calibration sensor used when balancing the gradiometer.

With reference to FIGS. 38 and 39, the manner in which the balance of the bars 41 and 42 is achieved will be described. A pair of displacement sensors formed by capacitors 400 and 401 are provided for two main purposes:

1. To measure the residual linear acceleration sensitivity of each bar 41 (and 42) to enable the bars to be mechanically balanced using the grub screws 301 described with reference to FIG. 24, before operation at low temperatures; and
2. To measure the induced linear acceleration sensitivity of each bar 41 and 42.

The capacitor 400 is formed by the previously described capacitor plate 518a and the surface 41a of the bar 41. A second circuit the same as that shown in FIG. 39 is used to measure the change experienced by the capacitor 401. That circuit is the same as FIG. 38 except the capacitor 400 is replaced by the capacitor 401 which is formed by a capacitor plate and surface 41a relating to another of the transducers 71.

The bars 41 and 42, in their respective housings, are rotated in a jig (not shown) through 360°. This provides an acceleration range of 2 $g_E$, which is typically 100 times greater than the accelerations which may be conveniently applied at low temperature. A typically requirement is for the capacitors 400 and 401 to be able to detect 0.1 nm over a period of 1 to 20 minutes. A pair of capacitors 400 and 401 is required for each bar to provide some discrimination against sensor drift, since rotation of the bar 41 will cause one capacitor 400 to increase and the other capacitor 401 to decrease by the same amount, as is shown in FIG. 38, whereas thermal expansion will cause both outputs of the capacitors 400 and 401 to increase. The capacitors 400 and 401 remain in place, even though they are unusable at low temperatures, and therefore their components need to be non-magnetic so as to not interfere with the operation of the gradiometer and, in particular, its nearby superconducting circuitry.

FIG. 38 shows that as the bar 41 pivots, the gap applicable to the capacitor 400 decreases and the gap of the capacitor 401 increases.

The capacitors 400 and 401 are formed by the face 41a of the bar 41 (and the corresponding face on the other bar 42) and second plates 405 which are spaced from the face 41a. The gap between the plates of the respective capacitors 400 and 401 must typically be resolved to about 1 ppm.

The capacitor 400 forms a high Q-factor resonant circuit with inductor 410. The inductor 410 and capacitor 400 are provided parallel to capacitors 411 and 412 and connect via capacitor 413 to an amplifier 414. The output of the amplifier 414 is provided to a frequency counter 415 and also fed back between the capacitors 412 and 411 by line 416. The capacitor 400 therefore determines the operating frequency of the amplifier 414 which can be read to a high precision.

If the bar 41 is out of balance, the frequency counter 45 will tend to drift because of the imbalance of the bar. This can be adjusted by moving the grub screws 301 into and out of the masses as previously described until balance takes place. The amplifier 414 can then be disconnected from the frequency counter 415 so that the gradiometer can be arranged within the Dewar 1 with the other parts of the circuits shown in FIG. 39 in place.

Figure 40:
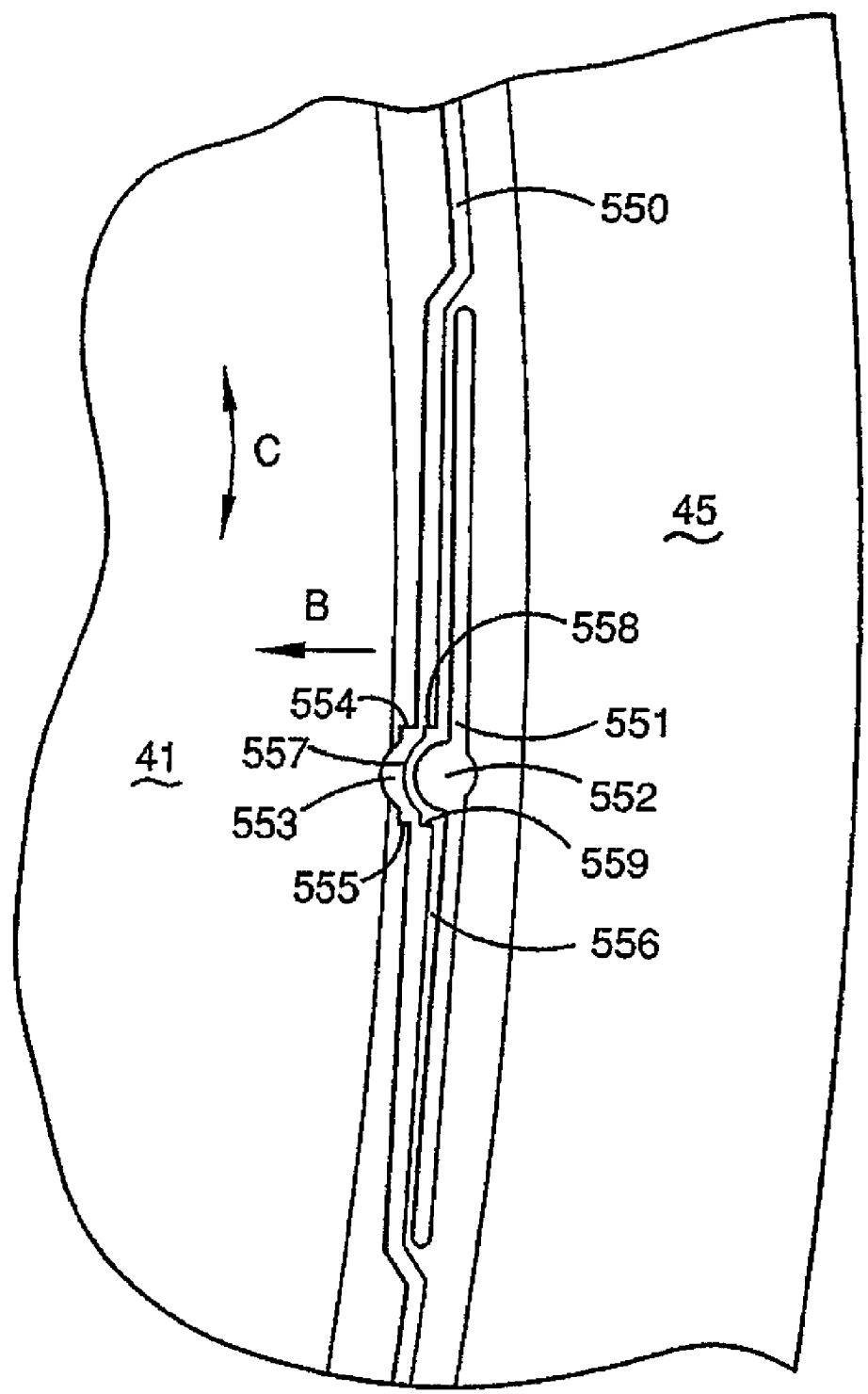
FIG. 40 is a detailed view of the part of FIG. 24 circled and marked A.

FIG. 40 is a detailed view of part of the bar 41 and housing 45 shown in FIG. 24 and marked by the circle A. Because the bar 41 is connected to the housing 45 by a very thin flexure web 59, if the bar 41 moves too much it may exceed the elastic limits of the flexure web 59. This can degrade the flexure joint and therefore the movement of the bar 41 under the influence of differences in gravitational field experienced at ends of the bar 41.

The amount of movement of the bar 41 which would normally take place and which is required in order to provide signals indicative of likely change in the gravitational field is in the order of 10 microns. Typically the bar 41 is cut from the housing 45 by a wire cutting operation which makes a cut such as that labelled 550 in FIG. 40 which has a thickness of about 60 microns. Thus, the amount of space which is available for the bar 41 to move greatly exceeds that which is required and that which may exceed the elastic limit of the flexure web 59. To prevent the bar 41 from moving beyond the elastic limit (such as more than plus or minus 10 microns) a cut 551 is made adjacent the end of the bar 41. A similar cut is made at the other end of the bar 41 which is not shown in FIG. 40. The cut 551 is provided with an enlarged hole 552. The cut 550 which defines the end of the bar 41 is provided with a profiled section 553 which defines a first abutment surface 554 and a second abutment surface 555.

The very thin strip of material 556 between cut 551 and the cut 550 has a profile 557 which matches the profile 553 except that abutment surfaces 558 and 559 formed at the end of the profile 557 are spaced apart by a distance of 20 microns less than the space between the abutment surface 554 and 555. Thus, the abutment surfaces 558 and 559 can move in the direction of arrow B (as will be explained hereinafter) so that the abutment surfaces 558 and 559 move into the profile 553 adjacent to and slightly spaced from the surfaces 554 and 555.

The thin strip of material 506 is moved in the direction of arrow B to so locate the abutment surfaces 558 and 559 by inserting a pin into the hole 552 which pushes the strip of material 556 in the direction of arrow B so that the surfaces 558 and 559 register with the surfaces 554 and 555. Thus, the surfaces 554 and 558 are spaced apart by a distance of about 10 microns and the surfaces 555 and 559 are spaced apart by a distance of about 10 microns. Thus, when the bar 41 moves in the direction of double-headed arrow C in FIG. 40 about the flexure web 59, the amount of movement is limited to 10 microns because the surface 554 will then engage the surface 558 and the contact of those surfaces will prevent further movement of the bar 41. Similarly, if the bar 41 is moved in the opposite direction, then the surface 555 contact the surfaces 559 to again limit the movement to about 10 microns.

Therefore, movement of the bar 41 is limited to a movement within the elastic limit of the flexure web 59 so the web does not become degraded and adversely influence operation of the gradiometer.

FIGS. 41 and 42 are more detailed drawings showing the connector 5a which is used to connect electrical signals from inside the Dewar 1 to componentry (not shown) outside the Dewar 1. In particular, the structure and circuit of FIGS. 41 and 42 is intended to shield the SQUID devices 367 from RF interference which may otherwise take place if there is simply a wire terminal passing through the end plate 4 to the external componentry.

The connector 5a comprises a container 560 which has a bottom wall 561 sealed to end plate 4 by an O-ring 562. A lead such as that marked 563 passes from inside the Dewar 1 through end plate 4 to a feed through filter 564 mounted on the bottom wall 561. A first baffle 567 supports a three terminal cap 565 which is connected to the feed through filter and the cap 565 is connected to a relay 566 which is supported on a second baffle 567. The relay 566 includes a relay switch 568 (see FIG. 42) which in turn passes through a connecting element 570 on the container 560 to a lead 571 to connect to the external componentry (not shown).

As is shown in FIG. 41, the lead 563 connects to the feed through filter 564 which is comprised of an inductor 571 and a capacitor 572 which is connected parallel to the inductor 571 on one side and to earth on the other side. The inductor 571 connects to the three terminal cap 565 which comprises an inductor 573, an inductor 574 and a capacitor 575. The capacitor 575 is connected parallel to the inductors 573 and 574 on one side and is earthed on the other side. The inductor 574 connects to the relay 566 which comprises a relay coil 575 and the relay switch 568. When it is desired to conduct signals from the lead 563 to the lead 571, current is supplied to the relay coil 575 to close the switch 568 so that the signals can pass through the filter 564, the three terminal cap 565, the relay switch 568 to the lead 571. The relay being opened when signals are not conducted cuts off the circuit from the lead 571 to the lead 563 and the three terminal cap 565 and feed through filter 564 further shield the SQUID device within the Dewar 1 during operation of the gradiometer so as to eliminate RF interference from outside sources, such as television signals and the like, from being conducted through the terminal 5a to the SQUID devices 367.

In other embodiments the capacitors 572 and 575 may be replaced by resistors.

FIG. 42A shows a further part of the RF shielding located in the connectors 5b. The wires 563 (only one shown in FIGS. 41 and 42A) each comprise twisted wire pairs with each pair being individually screened. Each wire in each pair of wires 563 is connected to inductor 579a and 579b and two resistors 579c which are connected in parallel with the respective inductors 579a and 579b to provide further RF attenuation.

Figure 43:
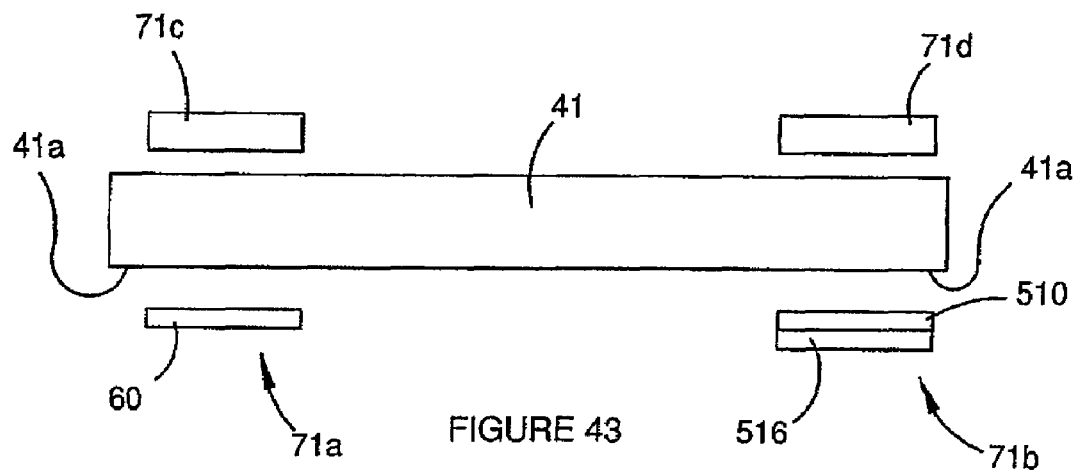
FIG. 43 is a diagram of a sensor bar and transducer configuration of one embodiment of the invention.
Figure 44:
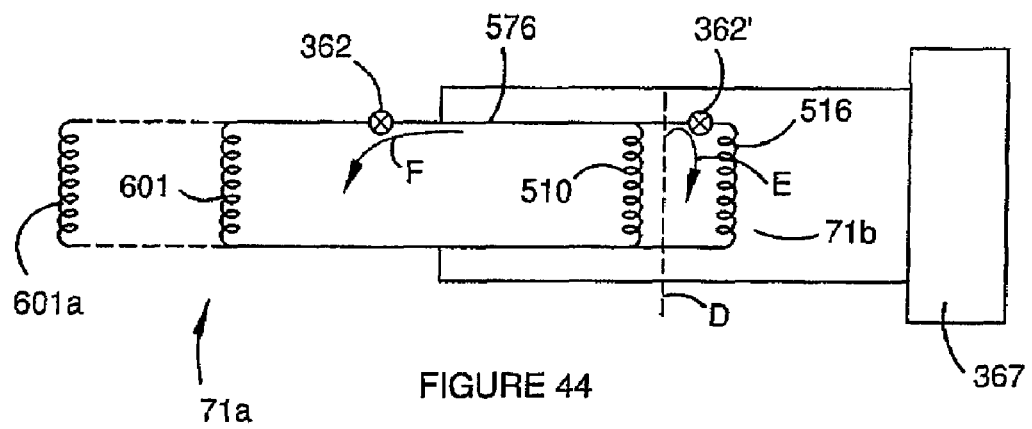
FIG. 44 is a circuit diagram of the configuration shown in FIG. 43.

FIGS. 43 and 44 show the physical configuration and circuit diagram of one of the measurement bars (i.e. bar 41) and a circuit diagram respectively which illustrate tuning of the effective spacing of the sensor coil of each transducer with respect to the edge 41a of the bar 41. In the embodiments shown, the transducer 71b is provided with two coils 510 and 516 which may be the coils previously described with reference to FIG. 28. The coils 510 and 516 are separated by a space of about 1 mm. Heat switch 362 is provided in the loop formed by the coils 510 and 516 and the coil 601 of the transducer 71a at the other end of the bar 41. In order to ensure that the coils 601 and 510 are spaced at equal distance from the surfaces 41a of the bar 41, the current flowing through the loop formed by the coils 510, 516 and 601 is proportioned between the coils 510 and 516 to form a virtual coil at, for instance, the location D shown in FIG. 44. By changing the proportion of the current which flows through the coils 510 and 516, the position D changes between the coils to form an effective virtual coil at that position. Thus, if the coils 510 and 601 are not equally spaced from their respective surfaces 41a, the current induced in the loop can be altered to in turn alter the amount of current which flows through each of the coils 510 and 516 to adjust the position D and therefore the virtual location of a single coil formed from the coils 510 and 516 until the spacing matches that of the coil 601.

If desired, the coil 601 could be replaced by a double coil arrangement the same as that which forms the transducer 71b shown in FIG. 44. Of course, the transducers 71a and 71b can be identical to those described with reference to FIGS. 27 and 28 in which the coarse coil 511 forming a transformer is provided to step up the current which is supplied to the SQUID device 367. For ease of illustration, the additional coil 511 and the other componentry described with reference to FIG. 27 through to FIG. 33 is not shown.

As previously explained, the SQUID 367 is initially tuned by inducing a current into the loop formed by the coils 510 and 601. This is achieved by supplying current to the heating resistor 362 which forms a heat pump to elevate the part of the loop at the position of the resistor 362 to warm that part of the circuit above superconducting transition so that part of the circuit no longer super-conducts. Thus, a current can be supplied into the loop from, for example, inputs 517 described with reference to FIGS. 27 to 33 and which are not shown in FIG. 44, so that current circulates through the loop and the current supply connected to the terminals 517 and 518. The heating resistor 362 is then deactivated so that the part of the circuit again becomes super-conducting and the current supply is disconnected from the loop so that the current induced in the loop continues to circulate through the loop under super-conducting conditions.

To proportion the current through the coils 510 and 516, a further heat switch 362' is provided which enables a current to be induced in the loop formed by the coils 510 and 516 which can travel in the direction of arrow E in FIG. 44. The current induced by the heat switch 362 circulates in the direction of arrow F. Therefore, the amount of current which passes through the coil 510 can be altered compared to that which passes through the coil 516, thereby shifting the position D of the virtual coil formed by the coils 510 and 516. Thus, the spacing of the coils so that the spacing of the coil 510 and the coil 601 are the same is electronically achieved.

That current is proportionally passed through the coils 510 and 516 to set the virtual position of the coil 510 at position D if necessary, so that the coils 601 and 501 are effectively spaced from the surfaces 41a by precisely the same distance. As the bar 41 moves under the influence of the gravity gradient, the coils 601 and 510 will therefore move relative to the surfaces 41a, changing the induced current passing through those coils which in turn is sensed by the SQUID device 367 to provide a measure of the movement and therefore of the gravity gradient experienced by the bar 41.

The coils 601 and 510 enable angular motion to be distinguished from lateral motion. Any lateral movement of the bar 41 to the right or left in FIG. 45 will produce the same effect on both coils, whereas an angular movement under the influence of the gravity gradient will cause one end of the bar 41 to move closer to its corresponding coil and the other end to move further away from its coil.

Figure 45:
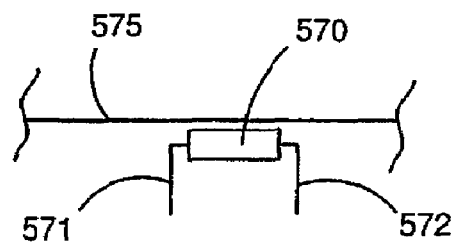
FIG. 45 is a diagram illustrating a heat switch of one embodiment of the invention.

Whilst the heat switches 362 previously described may take the conventional form of resistors, in one embodiment of the invention the heat switches comprise semi-conducting material such as a Hall effect sensor 570 as shown in FIG. 45. The Hall effect sensor 570 has leads 571 and 572 for powering the sensor to in turn elevate the temperature of part of the circuit labelled 575 to which it relates, above the super-conducting threshold so as to effectively open the circuit at that point so a current can be induced in the circuit from an outside source and so when the sensor is turned off and the device returns to cryogenic operation, the induced current supplied by the outside source simply continues to circulate through the circuit under superconducting conditions.

The use of the semi-conductor material and, in particular, the Hall effect sensor has the advantage that it works in the cold environment, is non-magnetic and also is very compact.

Further still, the Hall effect sensor 570 has a further advantage of being non-magnetic and heatable. The non-magnetic characteristics thereby avoid interference with a super conducting circuitry and the usually undesirable characteristic of heatability of the sensor 570 allows the sensor 570 to be used as the switch as previously explained. The sensor 570 also has high resistance in the order of 1K ohm at 4°K which is also advantageous.

Figure 45A:
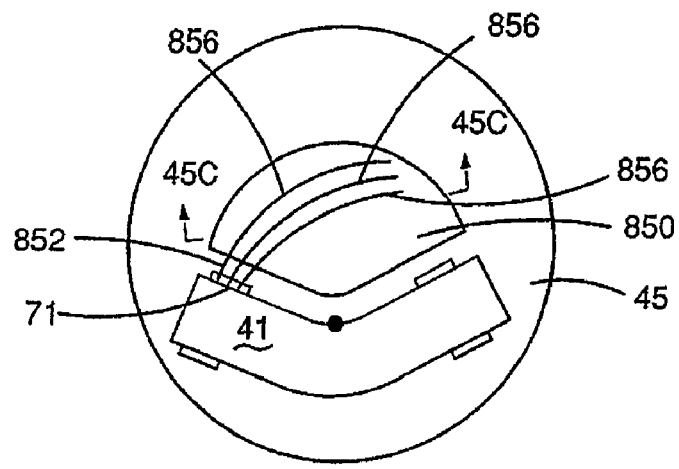
FIG. 45A is a view of a housing part of the gradiometer according to one embodiment.
Figure 45B:
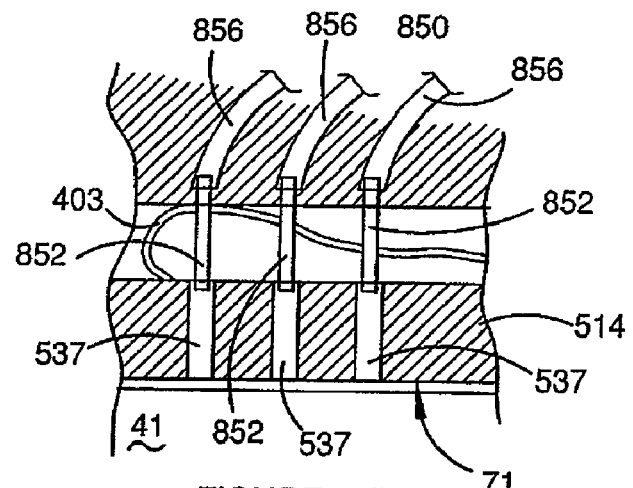
FIG. 45B is a detailed view of part of the embodiment of FIG. 45A.

FIGS. 45A to 45E show the heat switch 570 and its arrangement in the gradiometer in more detail. With reference to these figures and in particular FIG. 45A, the bar 41 in the housing 45 is shown along with the transducers 71. A circuit board 850 is supported by the housing in a groove 861 (see FIG. 45C) and located in place by screws 863 (only one shown in FIG. 45C). The circuit board 850 supports electronic circuitry such as the squid device and the like which are collectively shown by the block 859 in FIG. 45C. With reference to FIGS. 45A and 45B, as is also previously explained, the Macor core block 514 on which the coils 510 and 511 are deposited has strips 537 on its edge for conducting current to the circuitry 859. As previously explained, the block 514 is biased into place by spring 403.

The circuit board 850 has a plurality of conducting strips 856 which, in this embodiment are formed from super conducting material, namely niobium, which interconnect with the circuitry 859. The strips 537 are connected to the strips 856 by bridges 852 also formed from niobium. The bridges 852 are separated from the spring 403 by insulation which may be a varnish coating on the spring 403 or alternatively by suitably spacing the bridges 852 away from the spring 403.

Figure 45C:
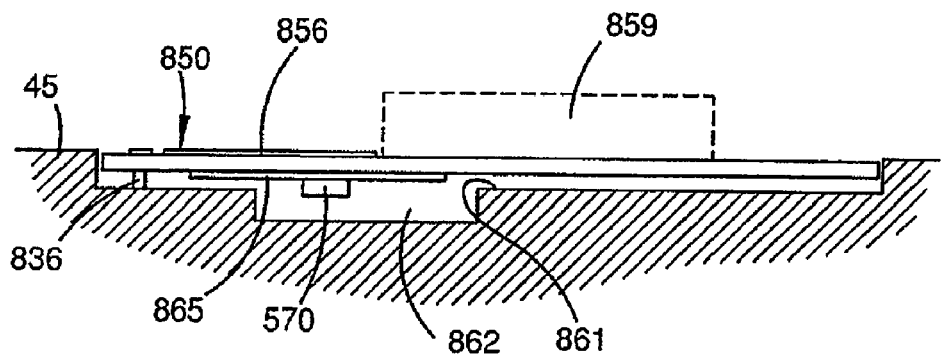
FIG. 45C is a cross-sectional view along the line 45C-45C of FIG. 45A.
Figure 45D:
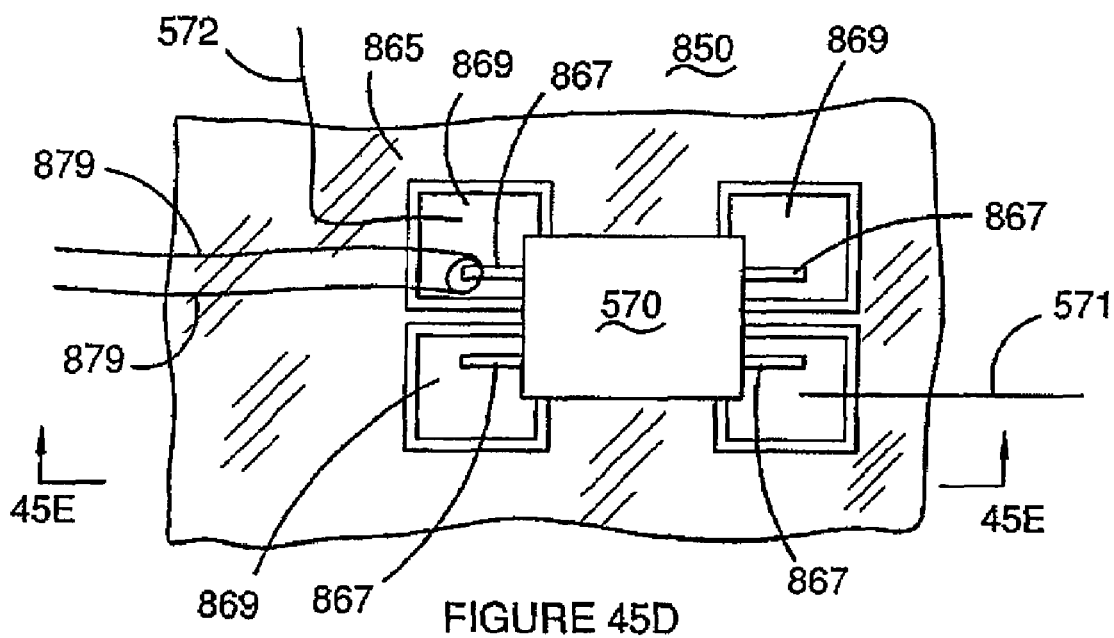
FIG. 45D is a detailed view of part of the arrangement shown in FIG. 45C from beneath.
Figure 45E:
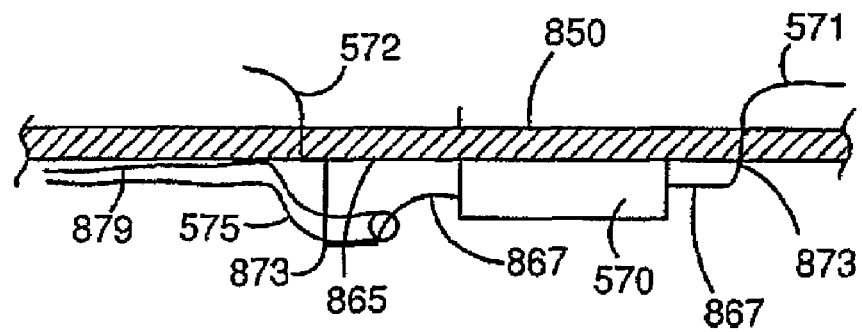
FIG. 45E is a cross-section view along the line 45E-45E of FIG. 45D.

As is best shown in FIG. 45C the circuit board 850 has a conducting substrate such as a copper substrate 865 on its under surface on which the Hall effect sensor 570 is located. As best shown in FIG. 45D the sensor 570 has four terminals or connector pins 867. In this embodiment only two of the pins 867 are used so as to cause a current to flow through the sensor 570 from current leads 571 and 572. The leads 571 and 572 connect with pads 869 formed from the copper substrate material which is etched at 870 to insulate the pads 867 from the remainder of the substrate 865. As shown in FIG. 45E the leads 571 and 572 pass through the circuit board 850 and fine copper wires 873 may be used to join the leads 571 and 572 to the pins 867.

The superconducting circuit 575 wraps around one of the pins 867 so that when current passes through the sensor 570 the sensor is heated and that heat is conducted to the pin 867 to in turn heat the part of the circuit 575 wrapped around the pin 867 to open the circuit 575 as previously explained. The circuit 575 is attached to the copper substrate 865 at locations 879 in FIG. 45D by varnish or the like so that when the sensor 570 is switched off the pin 867 and the circuit 575 quickly cools because heat can be conducted away through the substrate 865. Thus, the circuit 575 returns to its closed superconducting state.

The preferred embodiment of the heat switch 570 therefore takes advantage of the usually unwanted characteristic of such devices being the heating of the device, as well as the non-magnetic nature and high resistance of the device.

As is shown in FIG. 44, if the transducer 71a is also formed by a double coil 601 and 601a as shown in dotted lines, the current can be made to circulate only through each loop formed by the respective coils 510 and 516, and 601 and 601a, thereby producing zero current at lead 576 to which the SQUID device is connected. Therefore, perturbation of the lead microphonics leading to the SQUID device 367 goes away.

Figure 46:
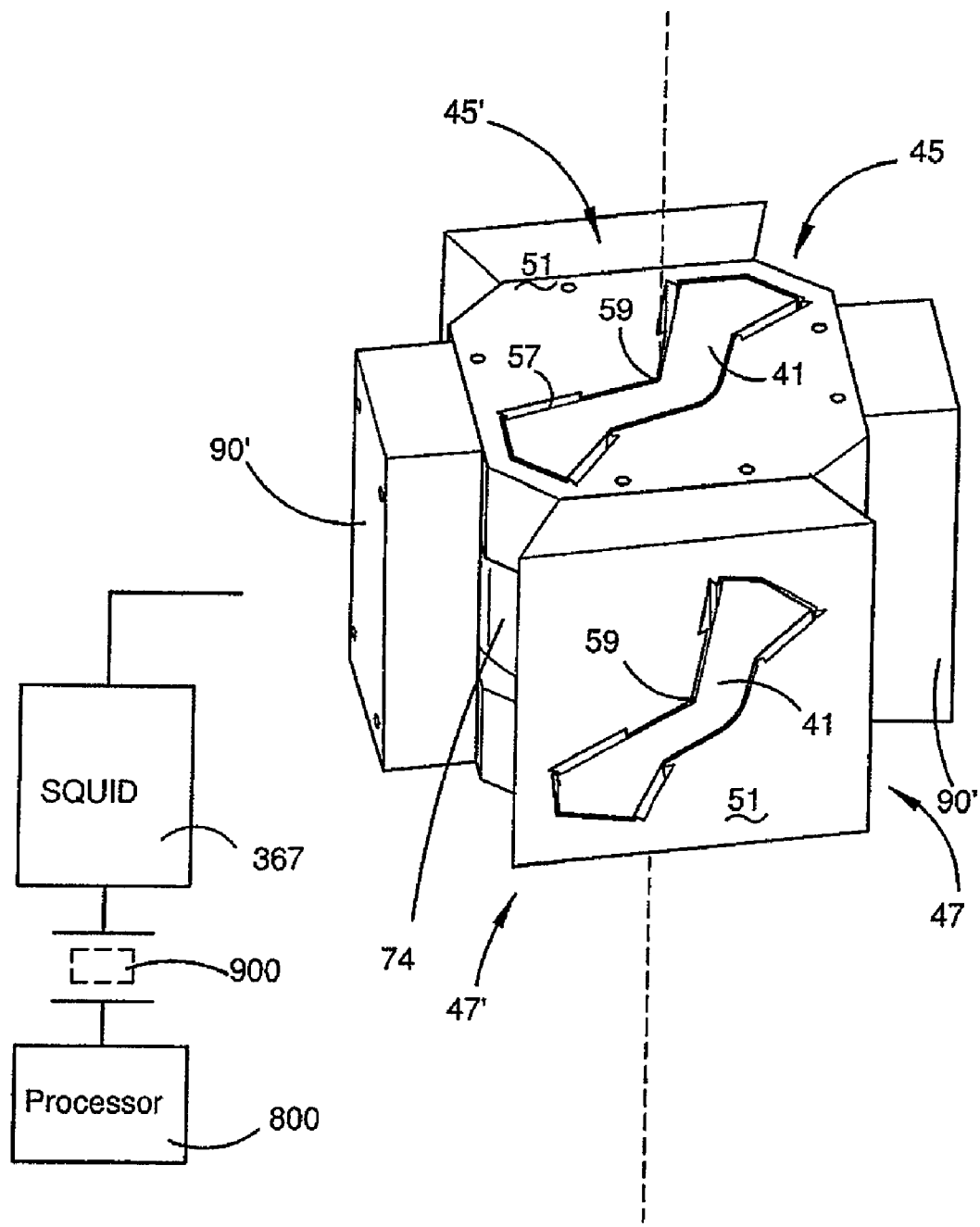
FIG. 46 is a schematic diagram of a gradiometer according to one embodiment of the invention.

In a still further embodiment of the invention, rather than providing one pair of measurement bars formed by the bars 41 and 42, at least one orthogonal extra pair of bars may be provided. The second pair of bars may be the same in configuration as the bars 41 and 42 and their respective housings 45 and 47 and may be located at the positions of the accelerometers 90" shown in FIG. 22. This arrangement is shown in FIG. 46. The first pair of bars provided in the housings 45 and 47 which are shown in FIGS. 22 and 46 provide respectively a measure of the difference between tensor components $G_{ZZ}$ and $G_{YY}$ ($G_{ZZ}$–$G_{YY}$) and the second pair of bars provided in the housings marked 45' and 47' in FIG. 46 provide a measure of the difference between the tensor components $G_{ZZ}$ and $G_{XX}$ ($G_{ZZ}$–$G_{XX}$).

It should be understood that the subscripts given in the components referred to above are with respect to the X and Y axes being in a horizontal plane and orthogonal, and a Z axis being a vertical axis. As previously mentioned, the bars 41 and 43 in the housings 45 and 47 are orthogonal with respect to one another and the bars in the housing 45' and 47' are also orthogonal with respect to one another. The bars 41 and 43 are also arranged in spaced apart planes which are orthogonal to spaced apart planes in which the bars of the housings 45' and 47' are located. It should be further understood that in FIG. 46, the gradiometer is not shown in the orientation it would take up when in use. When in use the gradiometer is effectively rotated 90° from the position shown in FIG. 46 so the dotted line in FIG. 46 forms the X axis or direction of flight of the aircraft carrying the gradiometer. The manner in which the movement of the bars in the housings 45' and 47' move and provide measurement signals is exactly the same as that described in the previous embodiments. Typically, when a survey is flown, the aircraft flies across the so-called geological strike of the region which is being surveyed. The provision of two sets of bars in the gradiometer shown in FIG. 46 results in a single flight simultaneously measuring data from the two sets of measurement bars and therefore has the advantage that the data is relevant to the same point along the survey lines.

In various embodiments of the invention, the data which is collected from the two sets of survey bars can be manipulated by a processor 800 shown in FIG. 46 to provide a measure of one or more than one component of the gravity gradient tensor. Because the data is received from two sets of measurement bars and is processed, the actual measure of a component of the tensor, such as the $G_{ZZ}$ component, can be obtained for individual points along a survey line. This therefore enables surveys to be conducted flying much wider lines than is the case with conventional geological surveys, and therefore the gradiometer of the embodiment of FIG. 46 can be used for both geological surveys and regional surveys with the survey lines being a relatively large distance apart. In situations where only two bars are used, a grid of data needs to be obtained in order to enable processing by a mathematical transform technique in order to obtain measurements of a single component of the tensor. This generally requires the grid to be produced by flying relatively close survey lines and because of the nature of the processing, the data is usually presented as a grid of data which provides an overall indication of the survey region. Thus, with the present embodiment of the invention, data which is collected from the actual point of interest is analysed to produce the component. If only two bars are used, a grid of data is needed and processing by a Fourier transform technique or the like is required where data from the particular point plus surrounding points is used to obtain a measure of the component. Thus, in order for the measure to be accurate, it is necessary that the survey lines be close together.

In still further embodiments of the invention a further set of measurement bars could be provided so that six bars are used to provide measurements to again enable various combinations of components to be manipulated by the processor to obtain measurements relative to any desired component of the gravity gradient tensor which may be required. These additional measurements should also allow additional processing to improve signal to noise.

As previously explained, data from the transducers (not shown in FIG. 46) which detect movement of the bars 41 and 43 is supplied to a SQUID device 367. The SQUID device 367 is only schematically shown in FIG. 46 for illustration purposes. Data produced by the SQUID device can be manipulated by processor 800 which can be physically connected to the gradiometer of FIG. 46 but which, more likely than not, is a separate processor at a remote location. If the processor 800 is at a remote location, data from the SQUID device 367 and other processing componentry associated with the gradiometer can be recorded on a recordable medium 900 and loaded into the processor 800 for manipulation or can be forwarded to the processor 800 by a communication link. The processor 800 processes the data obtained from the two sets of measurement bars in the following manner:

$$G_{XX}+G_{YY}+G_{ZZ}=0 \quad \text{(Equation 1)}$$

$$G_{ZZ}-G_{XX} \quad \text{(Measurement 1)}$$

$$G_{ZZ}-G_{YY} \quad \text{(Measurement 2)}$$

equation 1 being a known relationship between the components of the gravity gradient tensor given in equation 1;

measurement 1 being the measurement obtained by the first pair of bars;

measurement 2 being the measurement obtained by the second pair of bars;

adding measurements 1 and 2 gives:

$$G_{ZZ} - G_{XX} + G_{ZZ} - G_{YY} = 2G_{ZZ} - G_{XX} - G_{YY} \quad \text{(Equation 2)}$$
$$= 2G_{ZZ} - (G_{XX} + G_{YY})$$

from equation 1 $G_{XX}+G_{YY}=-G_{ZZ}$ and substituting into equation 2 gives:

$$2G_{ZZ}-(-G_{ZZ})=3G_{ZZ}$$

Since modifications within the spirit and scope of the invention may readily be effected by persons skilled within the art, it is to be understood that this invention is not limited to the particular embodiment described by way of example hereinabove.

In the claims which follow and in the preceding description of the invention, except where the context requires otherwise due to express language or necessary implication, the word "comprise" or variations such as "comprises" or "comprising" is used in an inclusive sense, i.e. to specify the presence of the stated features but not to preclude the presence or addition of further features in various embodiments of the invention.

The invention claimed is:

1. A heat switch for temporarily heating part of a superconducting circuit above a superconducting transition temperature, comprising:
   at least one circuit part formed from a superconducting material;
   a heat switch adjacent the circuit part;
   the heat switch being non-magnetic and formed from a semi-conducting material operational under cryogenic conditions.

2. The heat switch of claim 1 wherein the non-magnetic heat switch formed of semi-conducting material comprises a cryogenic Hall effect device.

3. A gravity gradiometer for measuring components of a gravity gradient tensor, comprising:
   a sensor for providing a measure of at least one component of the gravity gradient tensor;

a superconducting circuit for transmitting electrical signals within the gradiometer to facilitate measurement of the at least one component of the gravity gradient tensor; and a heat switch being non-magnetic and formed from a semi-conducting material operational at cryogenic temperatures for warming part of the circuit to a temperature above a superconducting transition to open the circuit to enable an initial current to be induced in the circuit from an external current source.

4. The gradiometer of claim 3 wherein the non-magnetic heat switch formed of semi-conducting material comprises a cryogenic Hall effect device.

5. The gradiometer of claim 3 wherein the heat switch has a pair of pins for supplying current to the heat switch to heat the heat switch, the super-conducting circuit being provided around or adjacent one of said pins, a conducting substrate arranged in heat conducting disposition with respect to the super-conducting circuit so that when the circuit is closed after heating to a super-conducting transition state, heat is conducted away from the pin and the super-conducting circuit by the substrate.

6. The gradiometer of claim 5 wherein the substrate comprises a copper substrate.

7. The gradiometer of claim 5 wherein the super-conducting circuit is arranged in heat conducting disposition with respect to the substrate by being attached to the substrate by varnish.

8. The gradiometer of claim 5 wherein the heat switch is provided on one side of a circuit board, the other side of the circuit board containing processing circuitry, the circuit board being disposed adjacent the sensor, the circuit board having conducting strips for conducting current to the circuitry on the circuit board and the conducting strips being connected to the sensor by bridges.

9. The gradiometer of claim 5 wherein the sensor comprises a sensor mass and a transducer and the circuit forms part of the transducer for supplying a current indicative of movement of the mass in response to a gravity gradient.

10. The gradiometer of claim 9 wherein a plurality of the heat switches are formed in the circuit for enabling various parts of the circuit to be opened to induce currents in the various parts of the circuit.

11. A gravity gradiometer for measuring components of a gravity gradient tensor, comprising:
 a housing;
 a mass supported by the housing and movable relative to the housing in response to changes in the gravity gradient tensor;
 a sensor for providing an output signal indicative of the changes, the sensor being supported on a support member which in turn is supported by the housing;
 conductors on the support member for supplying electric current from the sensor;
 a circuit board supported by the housing and spaced from the support member, conductor strips on the circuit board for connecting the sensor to circuitry mounted on the circuit board; and
 a plurality of bridges extending between the conductors on the support member and the conductor strips on the circuit board;
 wherein a side of the circuit board opposite the conductor strips and circuitry has a heat switch formed from a non-magnetic material for warming part of the circuitry to a temperature above a super-conducting transition to open the circuitry to enable an initial current to be induced in the circuitry from an external current source.

12. The gradiometer of claim 11 wherein the conductor strips on the circuit board are formed from super-conducting material.

13. The gradiometer of claim 12 wherein the super-conducting material is niobium.

14. The gradiometer of claim 11 wherein the heat switch comprises a non-magnetic heat switch.

15. The gradiometer of claim 14 wherein the non-magnetic heat switch is formed from a semi-conducting material.

16. The gradiometer of claim 14 wherein the semi-conducting material comprises a cryogenic Hall effect device.

17. The gradiometer of claim 11 wherein the heat switch has a pair of pins for supplying current to the heat switch to heat the heat switch, a super-conducting circuit being provided around or adjacent one of said pins, a conducting substrate arranged on the circuit board and in heat conducting disposition with respect to the super-conducting circuit so that when the circuit is closed after heating to a super-conducting transition state, heat is conducted away from the pin and the super-conducting circuit by the substrate.

18. The gradiometer of claim 17 wherein the substrate comprises a copper substrate.

19. The gradiometer of claim 18 wherein the super-conducting circuit is arranged in heat conducting disposition with respect to the substrate by being attached to the substrate by varnish.

20. The gradiometer of claim 4 wherein the heat switch has a pair of pins for supplying current to the heat switch to heat the heat switch, the super-conducting circuit being provided around or adjacent one of said pins, a conducting substrate arranged in heat conducting disposition with respect to the super-conducting circuit so that when the circuit is closed after heating to a super-conducting transition state, heat is conducted away from the pin and the super-conducting circuit by the substrate.

21. The gradiometer of claim 20 wherein the substrate comprises a copper substrate.

22. The gradiometer of claim 20 wherein the super-conducting circuit is arranged in heat conducting disposition with respect to the substrate by being attached to the substrate by varnish.

23. The gradiometer of claim 20 wherein the heat switch is provided on one side of a circuit board, the other side of the circuit board containing processing circuitry, the circuit board being disposed adjacent the sensor, the circuit board having conducting strips for conducting current to the circuitry on the circuit board and the conducting strips being connected to the sensor by bridges.

24. The gradiometer of claim 20 wherein the sensor comprises a sensor mass and a transducer and the circuit forms part of the transducer for supplying a current indicative of movement of the mass in response to a gravity gradient.

25. The gradiometer of claim 24 wherein a plurality of the heat switches are formed in the circuit for enabling various parts of the circuit to be opened to induce currents in the various parts of the circuit.

* * * * *